(12) United States Patent
Holcomb

(10) Patent No.: US 6,586,370 B1
(45) Date of Patent: Jul. 1, 2003

(54) METAL BORIDE BASED SUPERCONDUCTING COMPOSITE

(75) Inventor: Matthew J. Holcomb, Manhattan Beach, CA (US)

(73) Assignee: Nove' Technologies, Inc., El Segundo, CA (US)

( * ) Notice: Subject to any disclaimer, the term of this patent is extended or adjusted under 35 U.S.C. 154(b) by 202 days.

(21) Appl. No.: 09/834,574

(22) Filed: Apr. 12, 2001

Related U.S. Application Data

(63) Continuation-in-part of application No. 09/728,029, filed on Nov. 30, 2000, now abandoned, which is a continuation-in-part of application No. 09/604,857, filed on Jun. 27, 2000, now abandoned, which is a continuation-in-part of application No. 09/433,267, filed on Nov. 4, 1999, now Pat. No. 6,420,318, which is a continuation-in-part of application No. 08/806,697, filed on Feb. 26, 1997, now Pat. No. 5,998,336.

(51) Int. Cl.⁷ .......................... H01L 39/00; H01B 12/00; B32B 9/00
(52) U.S. Cl. .................... 505/236; 505/434; 174/125.1; 428/403; 428/930
(58) Field of Search ................................ 505/236, 434; 428/403, 930; 174/125.1; 427/62, 212

(56) References Cited

U.S. PATENT DOCUMENTS

| 4,575,927 A | * | 3/1986 | Braginski et al. ............. 29/599 |
| RE32,178 E | | 6/1986 | Yoshizaki |
| 4,971,944 A | | 11/1990 | Charles et al. |
| 5,091,362 A | | 2/1992 | Ferrando |
| 5,248,661 A | | 9/1993 | Mole et al. |
| 5,998,336 A | | 12/1999 | Holcomb |

FOREIGN PATENT DOCUMENTS

| JP | 54-97775 | * | 8/1979 |
| JP | 64-76960 | * | 3/1989 |
| JP | 03-275505 | * | 12/1991 |

* cited by examiner

*Primary Examiner*—Brian K. Talbot
(74) *Attorney, Agent, or Firm*—Blakely, Sokoloff, Taylor & Zafman

(57) ABSTRACT

The invention provides a superconductor comprising particles made of a metallic boride superconductive material, and a conductive material. The conductive material is selected to be driven to a superconductive state when in proximity to the superconductive material. An unbroken length of the conductive material is located sufficiently close to a plurality of the particles to be driven to a superconductive state by the superconductive material.

13 Claims, 18 Drawing Sheets

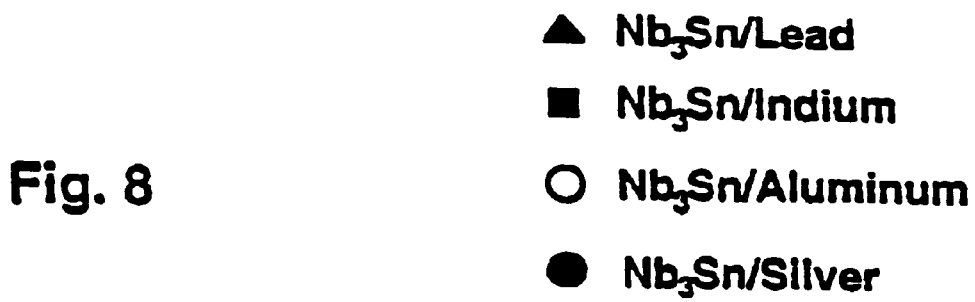
Fig. 8
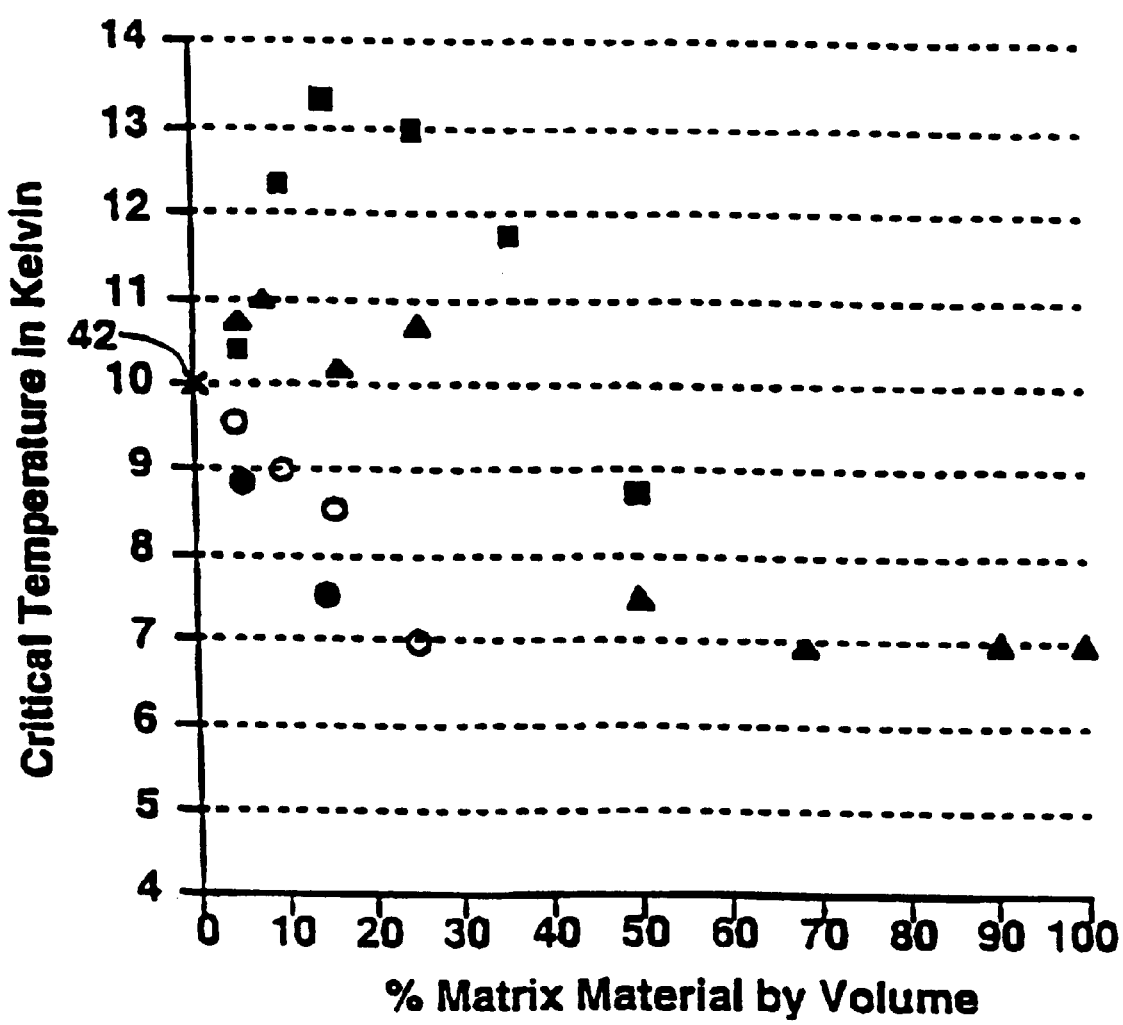

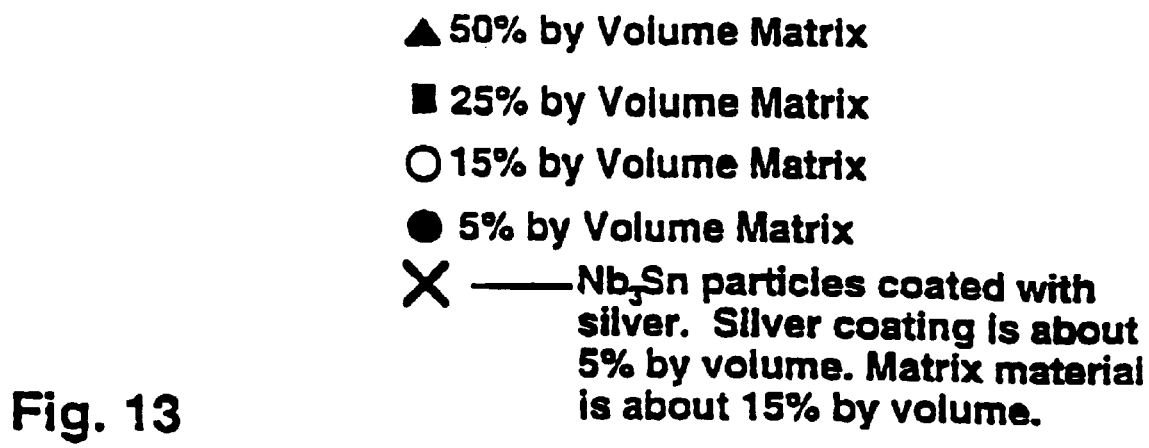
Fig. 13
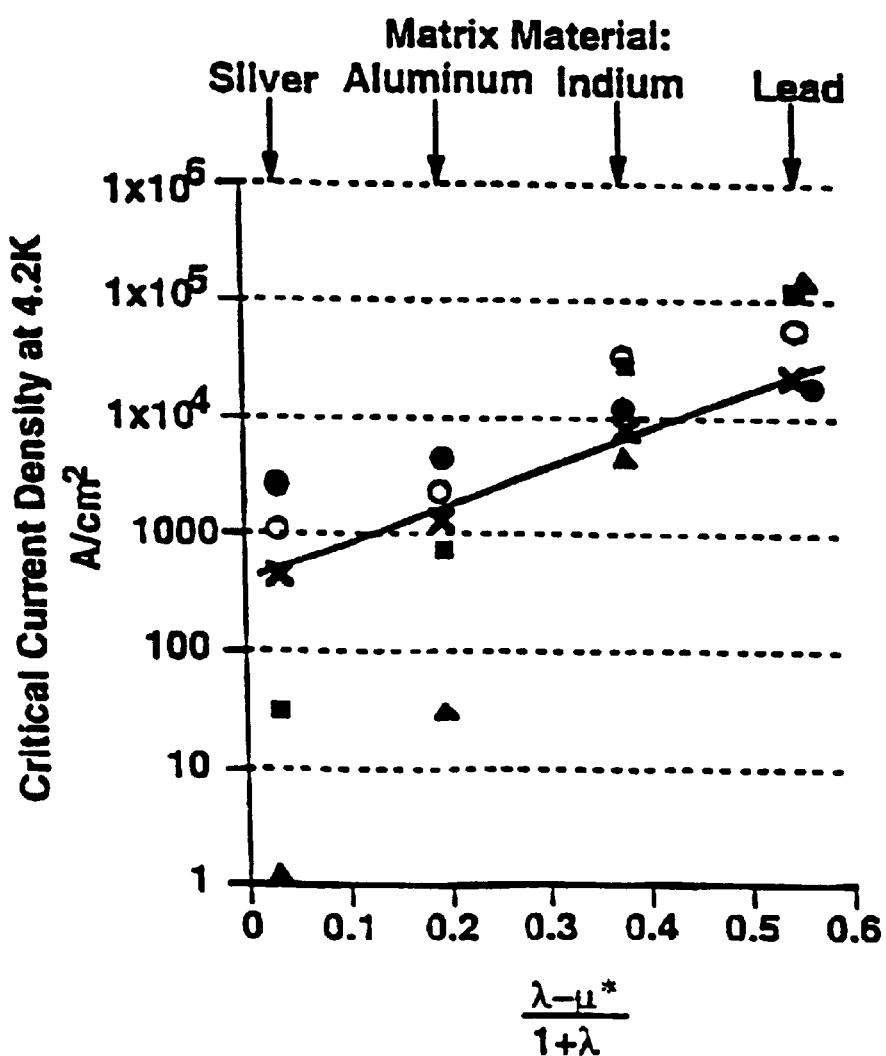

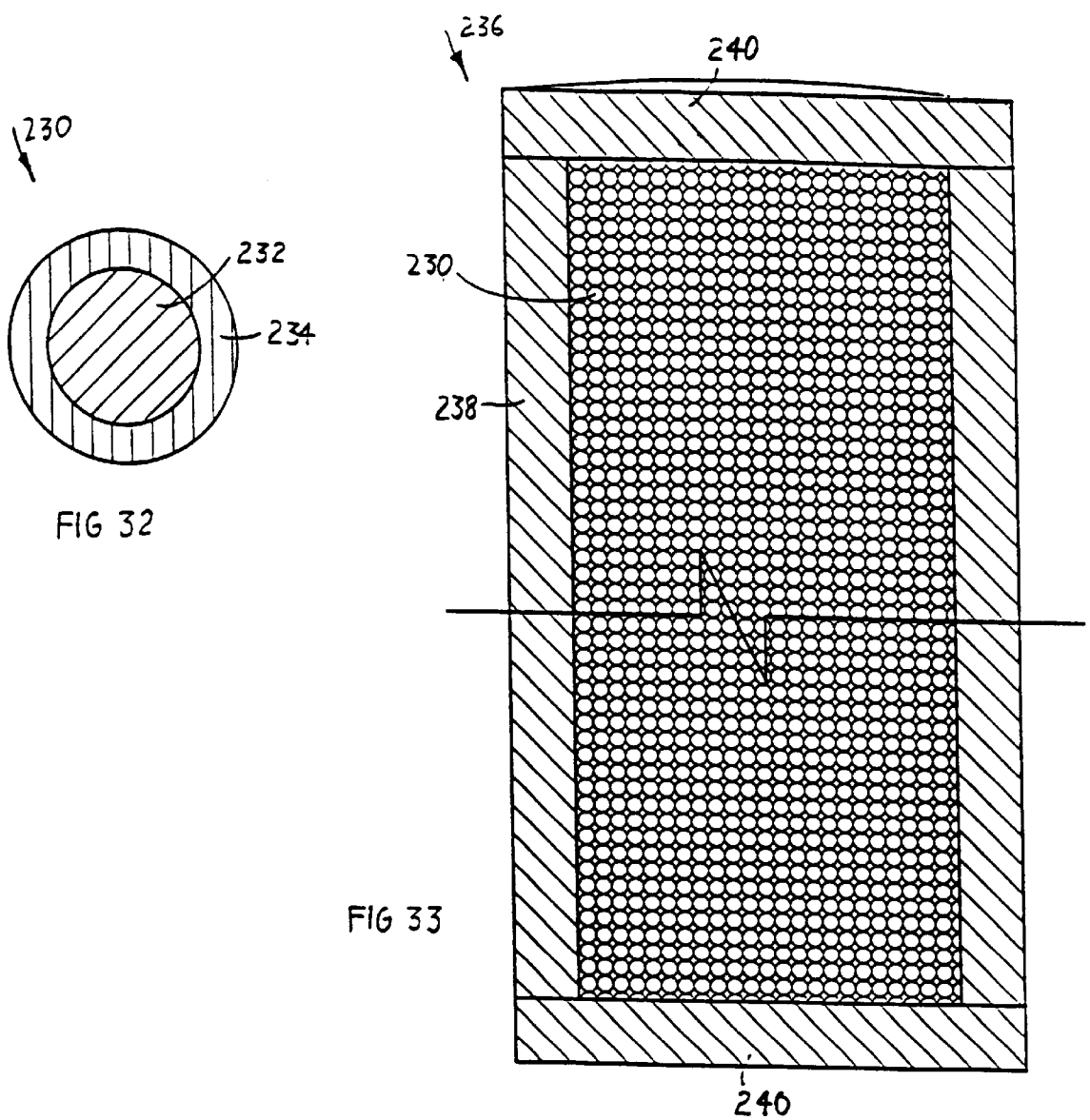
FIG 32
FIG 33
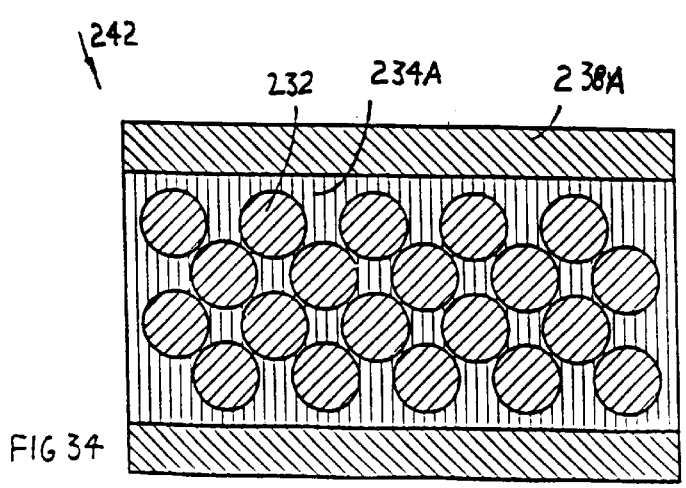
FIG 34

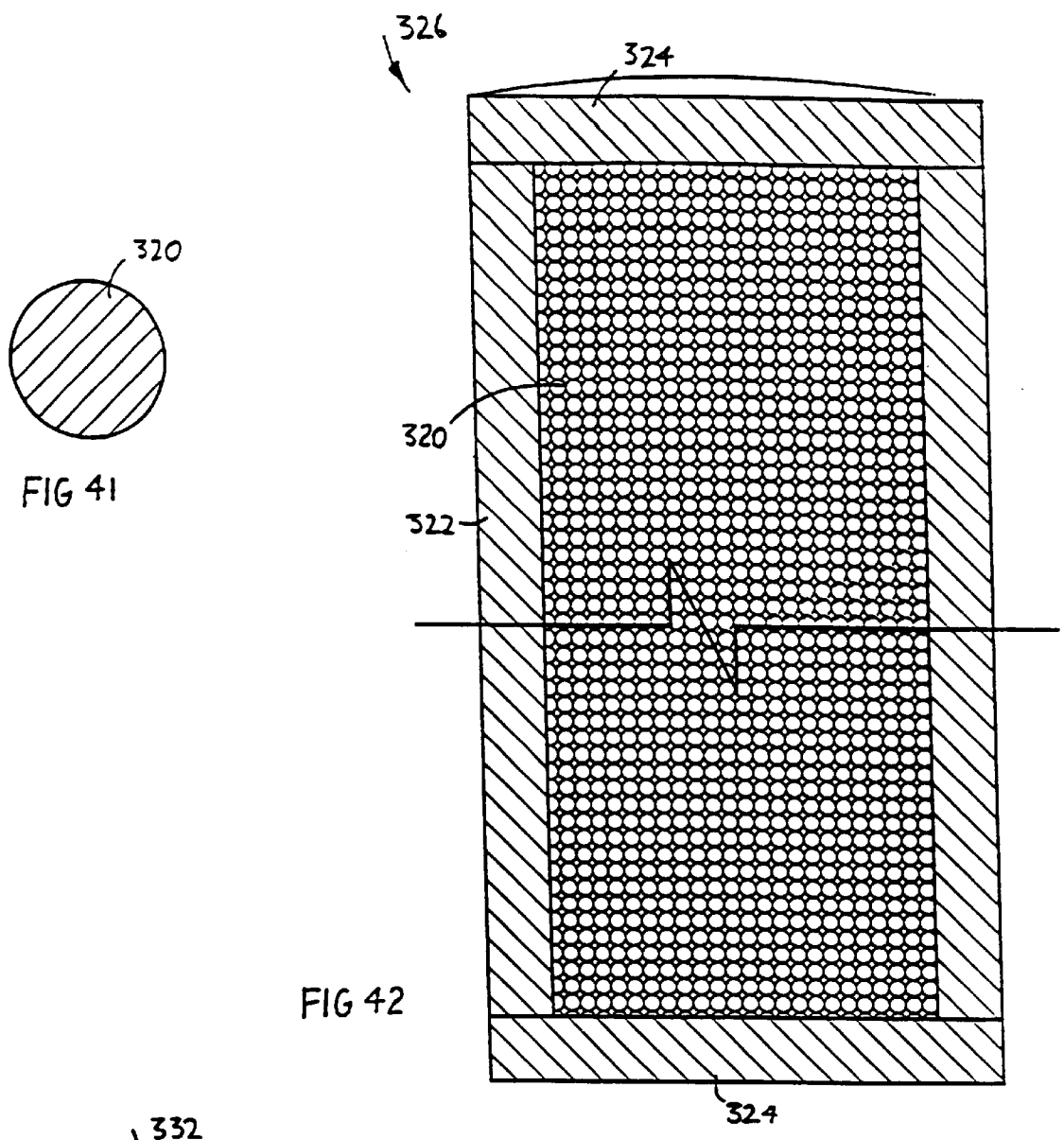

METAL BORIDE BASED SUPERCONDUCTING COMPOSITE

CROSS-REFERENCE TO RELATED APPLICATIONS

This is a Continuation-In-Part of U.S. patent application Ser. No. 09/728,029, filed on Nov. 30, 2000 now abandoned, which is a Continuation-In-Part of U.S. patent application Ser. No. 09/604,857, filed on Jun. 27, 2000 now abandoned, which is a Continuation-In-Part of U.S. patent application Ser. No.: 09/433,267 filed on Nov. 4, 1999 now U.S. Pat. No. 6,420,318 which is a Continuation-In-Part of U.S. Ser. No. 08/806,697 now U.S. Pat. No. : 5,998,336 filed on Feb. 26, 1997.

BACKGROUND OF THE INVENTION

1). Field of the Invention

The present invention relates to a superconductor.

2). Discussion of Related Art

The discovery of high critical temperature (Tc) superconducting ceramics (HTS ceramics) has inspired an enormous interest in their application. Conventional niobium alloy superconductors such as NbTi must be cooled to below 10K to achieve useful superconductivity. HTS superconductors, on the other hand, can have Tcs over 100K. Due to the great expense of cryogenic refrigeration, the HTS ceramics could find much wider application in industrial and laboratory devices. Of particular interest are materials which have Tc above 77K, because this is the temperature of liquid nitrogen, a common and relatively inexpensive refrigerant.

HTS ceramics have not been used in many potential applications because they suffer from a number of shortcomings. The most severe problems with the HTS ceramics are as follows:

1) HTS ceramics are brittle. They are not flexible and thus cannot be made into wires or other useful shapes. Cracks and boundaries between adjacent crystals severely limit supercurrent flow.

2) HTS ceramics are highly anisotropic. Supercurrents preferentially flow in certain directions with respect to the crystal lattice, reducing the maximum current density in randomly oriented multicrystalline pieces.

3) HTS ceramics are strong oxidizing agents. Most metals, such as copper, lead, tin, aluminum, indium and niobium, are oxidized by contact with the ceramic superconductors. Insulating oxide layers impede supercurrent flow. Only noble metals such as gold, silver palladium and their alloys are not oxidized by the HTS ceramics.

A less severe undesirable feature of the HTS ceramics is that they can lose their superconducting properties under certain circumstances. The superconducting structure inside the HTS ceramics has an abundance of oxygen atoms which are necessary for superconductivity. Heating, grinding, etching, or prolonged exposure to ambient atmosphere or vacuum may liberate the oxygen and destroy superconductivity. Both the oxygen content and the superconductivity can be restored by annealing the HTS ceramic in an atmosphere of oxygen.

It would be an advance in the art of applied superconductivity to provide a superconducting wire employing HTS ceramics that is ductile, has a high Tc, and has a high critical current density (Jc). Such a wire must overcome the problems with the HTS ceramics. Prior art HTS ceramic wires made of a combination of HTS ceramic particles in a silver matrix generally have poor superconducting properties such as low Jc. Also, bending the prior art wires tends to greatly reduce the Jc. This is highly undesirable.

There are other ceramic superconductor materials which have some of the same disadvantages as HTS cuprate materials. For example, the A15 family of superconductors such as $Nb_3Sn$ are also brittle materials (although they are not anisotropic and relatively nonreactive). Their poor mechanical properties have precluded their use in many applications requiring ductility such as wires. This is unfortunate because they generally have good superconducting properties such as relatively high Tcs, high critical magnetic fields, and high critical current densities.

Other examples of brittle, nonductile superconductors include materials possessing the NaCl crystal structure (the AB family), Laves phase ceramics, Chevrel phase ceramics and metallic borides. These materials may have superior superconducting properties, but are unusable in many applications (e.g., conducting wires) because they are brittle. It would be an advance in the art of applied superconductivity to provide flexible wires made from brittle superconductor materials.

U.S. Pat. No. 5,091,362 to Ferrando discloses a method for forming a silver coating on HTS ceramic particles. U.S. Pat. No. 4,971,944 to Charles et al. teaches a method for electroless deposition of gold onto HTS ceramic particles.

U.S. Pat. No. 5,041,416 to Wilson describes a superconducting composite material. Powders of HTS ceramic and normal metal are mixed and the mixture is subjected to heat and high pressure. The composite materials of Wilson have a relatively low Jc due to reactivity between the HTS ceramics and the metal matrix. The wires also have a low Jc if silver is used as the normal metal.

U.S. Pat. No. 5,202,307 to Hayashi describes a superconducting composite material having HTS ceramic particles in a metal matrix. The composite materials of Hayashi have a relatively low Jc due to reactivity between the HTS ceramic particles and the metal matrix and/or due to poor superconducting properties of the metal matrix materials.

U.S. Pat. No. 5,194,420 to Akihama describes a composite cuprate superconductor/metal superconducting material consisting of HTS ceramic particles dispersed in a matrix of silver. The composite materials of Akihama will also have a relatively low critical current density due to the choice of silver as the metal matrix material.

U.S. Pat. No. 5,081,072 to Hosokawa et al. describes a method preparing a HTS superconducting ceramic powder and forming the powder into a superconducting material. A low Jc is also a problem with the materials of Hosokawa.

U.S. Pat. No. 5,547,924 to Ito et al. describes a superconducting ceramic composite material having HTS ceramic particles in a noble metal matrix. The composite materials have relatively poor superconducting properties due to the poor superconducting properties of the metal matrix materials used.

U.S. Pat. No. 5,132,278 to Stevens et al. describes a cuprate superconductor wire having continuous filaments of HTS ceramic surrounded by metal matrix. A noble metal chemically protects the HTS ceramic. The wires of Stevens et al. are characterized in that they do not conduct current between wires, and do not rely on the superconducting proximity effect.

There exists a need for the HTS ceramic superconducting material that is ductile and has a high Jc that is not reduced by bending. Also, there exists a need for ductile superconducting materials made from brittle superconductors that have a high Jc high Tc, and high ductility.

SUMMARY OF THE INVENTION

The invention provides a superconductor comprising particles made of a planar diboride superconductive material, and a conductive material. The conductive material is selected to be driven to a superconductive state when in proximity to the superconductive material. An unbroken length of the conductive material is located sufficiently close to a plurality of the particles to be driven to a superconductive state by the superconductive material.

The planar diboride is preferably magnesium diboride.

The invention also provides a method of making such a superconductor. The invention also provides a method of making a wire of such a superconductor. An elongate member may be assembled from the particles and the conductive material, and be drawn into a wire.

BRIEF DESCRIPTION OF THE DRAWINGS

The invention is further described by way of example with reference to the accompanying drawings wherein:

FIG. 8 is a graph of critical temperature (Tc) versus volume % matrix material for four different matrix materials (silver, aluminum, indium, and lead);

FIG. 13 is a graph of critical density versus normalized electron-phonon coupling constant for the embodiment of FIG. 12 having a silver coating surrounding each superconductor particle;

FIG. 32 is a cross-sectional view of a two component granule used for making three-component wire in a powder-in-tube manufacturing process;

FIG. 33 is a cross-sectional view of an elongate member which is assembled utilizing a plurality of the granules of FIG. 32;

FIG. 34 is a cross-sectional view of wire that is rolled out of the elongate member of FIG. 33;

FIG. 41 is a cross-sectional view of a superconductor particle having bare outer surfaces that is used for making a two component wire in a powder-in-tube process;

FIG. 42 is a cross-sectional view of an elongate member which is assembled from a plurality of the granules of FIG. 41 and other components for making a two component wire; and FIG. 43 is a cross-sectional view of a wire that is drawn from the elongate member of FIG. 42.

DETAILED DESCRIPTION OF THE INVENTION

Materials and Compositions

Figure 1:
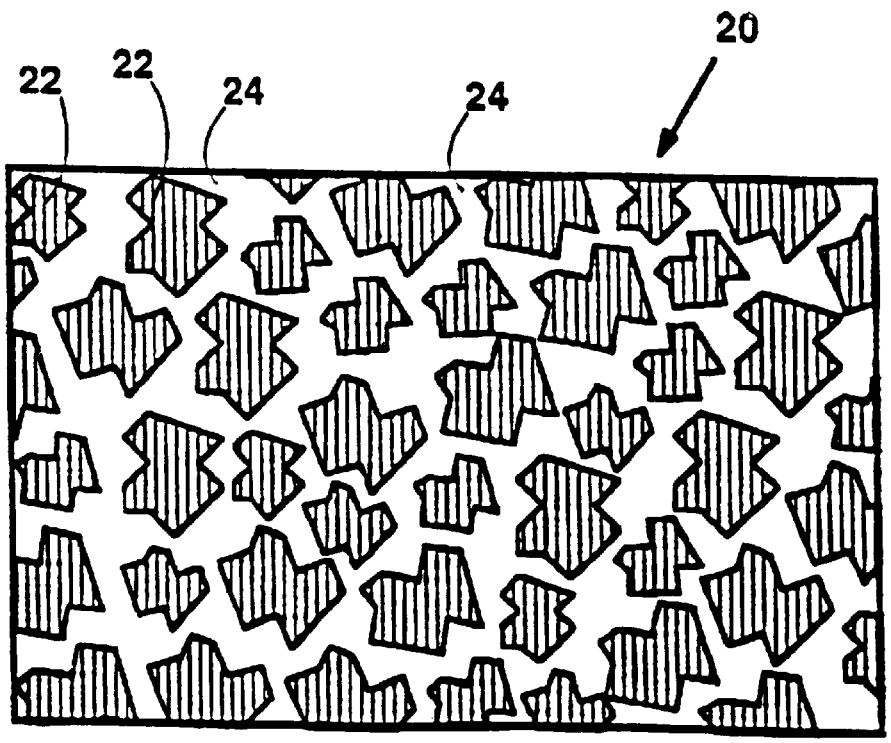
FIG. 1 is a cross-sectional view of an embodiment of the present invention having ceramic superconducting particles disposed in a metal matrix material.

FIG. 1 shows a magnified view of a composite material 20 according to the present invention. The composite material 20 has superconductor particles 22 made of brittle superconducting ceramic disposed in a metal matrix material 24. The superconductor particles 22 can have a wide range of sizes, and the sizes of the particles 22 do not need to be uniform. The particles preferably have sizes generally within the range of 1.5 nanometers to 10 microns in diameter, for example. The particles 22 are made of a brittle superconducting ceramic, such as an A15 compound, AB family superconductors, Laves phase superconductors, Chevrel phase superconductors, metallic borides or the like. Preferably, the particles are made of a material having a relatively high critical current density (e.g., greater than 100 kA/cm$^2$). Also preferably, the particles have high critical magnetic fields (e.g., greater than 5T). In general, the superconductor particles preferably have robust superconducting properties.

There are preferably no insulating contaminants between the superconductor particles 22 and the metal matrix material 24. A thin layer of grease, oxide or any other insulating material between the superconductor particles and metal matrix material can seriously degrade the superconducting properties of the composite material 20 by impeding supercurrent flow through the superconductor particle/metal matrix interface.

The particles 22 preferably have dimensions larger than the superconducting coherence length of the superconducting ceramic. Preferably, the superconductor particles have dimensions of about 3–500 times the superconducting coherence length of the superconductor particles, more preferably, the superconductor particles are about 5 to 10 times larger than the superconducting coherence length of the ceramic material. For most superconductor particle materials, it is preferable for the intrinsic superconductor particles to have dimensions less than 10 microns. The best size range depends upon the temperature at which the composite material is used, the $\lambda$ of the metal matrix material, the superconductor coherence length of the superconductor particles, the proximity effect decay length of the metal matrix material, and the inelastic mean free path of the metal matrix material (explained below), and possibly other factors.

For example, the A15 superconducting compounds (e.g., $Nb_3Sn$, $Nb_3Ge$, $Nb_3Al$, $V_3Ga$, $V_3Si$, $V_3Al$, $V_3In$, $Nb_3Ga$, $V_3Ge$, $Nb_3Ge$, $Nb_3Si$, $Ta_3Au$ and $Mo_3R$) generally have superconducting coherence lengths of approximately 2–3 nanometers. Therefore, for A15 compounds, the superconductor particles preferably have dimensions greater than 2–3 nanometers. For A15 compounds, particle sizes are preferably in the range of 100–5000 nm, or more preferably 10–500 nanometers. Larger sizes are also possible, but are typically less preferred because they may produce composites having less than optimal superconducting and mechanical properties.

Table 1 below lists several candidate materials useful for the intrinsic superconductor particles, their coherence lengths and their critical temperatures.

TABLE 1

Candidate superconductor materials

| Superconductor | Family/Phase | Critical Temperature | Maximum Coherence Length |
|---|---|---|---|
| A15 Compounds | A15 | 11–25 K. | 2–3 nm |
| MoC | AB | 14.3 K. | |
| NbN | AB | 17.3 K. | 4.0 nm |
| ZrN | AB | 10.7 K. | |
| $CaRh_2$ | Laves | 6.4 K. | |
| $CaIr_2$ | Laves | 6.2 K. | |
| $ZrV_3$ | Laves | 9.6 K. | 4.5 nm |
| $HfV_2$ | Laves | 9.4 K. | 3.9 nm |
| $Mo_6S_8$ | Chevrel | 1.6 K. | |
| $Cu_2Mo_6S_8$ | Chevrel | 10.7 K. | |
| $Yb_{1.2}Mo_6S_8$ | Chevrel | 8.7 K. | |
| $LaMo_6S_8$ | Chevrel | 6.6 K. | 7.8 nm |
| $La\ Mo_6S$ | Chevrel | 11.7 K. | |
| $Pb_{0.9}Mo_6S_{7.5}$ | Chevrel | 15.2 K. | 2.0 nm |
| $PbMo_6S_8$ | Chevrel | 12.6 K. | 2.3 nm |
| $BrMo_6S_8$ | Chevrel | 13.8 K. | |
| $MgB_2$ | Metallic Borides | 40.2 K. | 5 nm |

Ceramics useful for the intrinsic superconductor particles are not necessarily limited to those listed in Table 1.

The metal matrix material 24 is preferably made of a ductile metal (elemental metal, metal alloy, or metal mixture) that is susceptible to the superconducting proximity effect. In order to be susceptible to the proximity effect, the metal matrix material preferably has a high electron-boson coupling coefficient, typically an electron-phonon coupling coefficient, $\lambda$ (a unitless number). The metal matrix material must have a $\lambda$ greater than 0.2. More preferably the metal matrix material has a $\lambda$ greater than 0.5, and most preferably the metal matrix material has a $\lambda$ greater than 1.0. All else being equal, the higher the $\lambda$, the better. This is because the susceptibility to the proximity effect increases with $\lambda$. Table 2 below shows candidate matrix materials and their electron-phonon coupling coefficients.

TABLE 2

Candidate metal matrix materials

| Metal | Electron-Phonon Coupling, $\lambda$ |
|---|---|
| Lead | 1.55 |
| Tin | 0.72 |
| NbTi | 0.92 |
| Niobium (Nb) | 1.22 |
| Mercury | 1.62 |
| Tantalum | 0.69 |
| Titanium | 0.8 |

TABLE 2-continued

Candidate metal matrix materials

| Metal | Electron-Phonon Coupling, $\lambda$ |
| --- | --- |
| Vanadium | 0.8 |
| Indium | 0.81 |
| $Ti_{0.9}Bi_{0.1}$ | 0.78 |
| $Pb_{0.4}Tl_{0.6}$ | 1.38 |
| $Pb_{0.9}Bi_{0.1}$ | 1.66 |
| $Pb_{0.75}Bi_{0.25}$ | 2.76 |
| $Pb_{0.7}Bi_{0.3}$ | 2.01 |
| Lead/Indium Alloys | >1.5 |
| Lead/Bismuth Alloys generally | 2.3 |

Metals useful for the metal matrix material are not necessarily limited to those listed in Table 2. Many of the metal matrix materials in Table 2 are elemental materials (e.g., Lead, Tin, Niobium). These elemental materials are typically Type I superconductors and generally are not suitable for use in high magnetic field applications. For high magnetic field applications, Type II superconductors (e.g. metal alloys) should be used for the metal matrix materials. Examples of Type II alloys are NbTi and Lead-Bismuth alloys. Also, it is known that some elemental metals act as Type II superconductors if under sufficient mechanical stress. Stressed niobium, for example, acts as a Type II superconductor and can be used as a metal matrix material in high magnetic field applications, though well annealed, unstressed niobium is a classic Type I superconductor.

Also, the metal matrix material preferably has a long proximity effect decay length. The proximity effect decay length is a fundamental material property. The decay length is a result of dephasing of electron and hole wave functions as they travel through the matrix material (due to different electron and hole velocities). The decay length is typically not as important as $\lambda$ because most candidate materials have similar decay lengths. Table 3 shows decay lengths for selected candidate materials. It is noted that the decay length is inversely proportional to absolute temperature.

TABLE 3

Decay lengths for selected matrix materials

| Metal | Proximity Effect Decay Length at 77 K. in nm |
| --- | --- |
| Lead | 29 |
| Tin | 30 |
| NbTi | 22 |
| NbTi, (Nb) | 22 |
| Mercury | 25 |
| Indium | 28 |
| Lead/Bismuth Alloys | 25–28 |

The superconductor particles 22 preferably have a critical temperature higher than the critical temperature of the metal matrix material 24.

Figure 2:
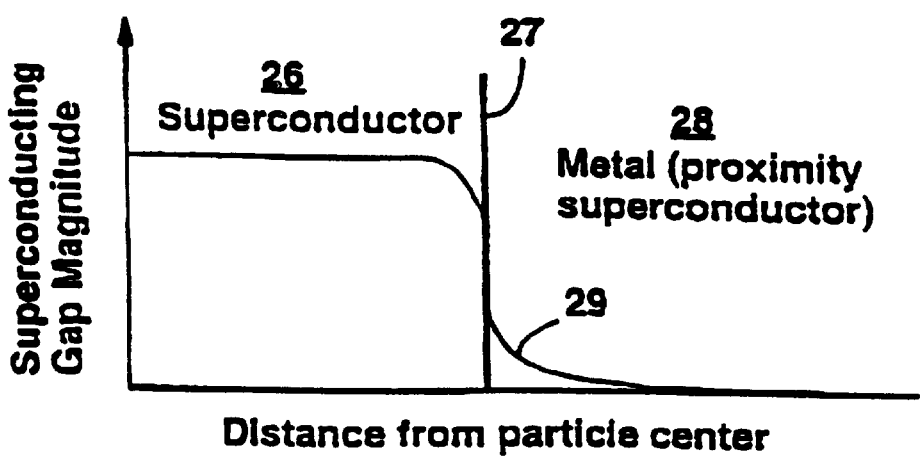
FIG. 2 is a graph illustrating the variation of the superconducting gap magnitude near a boundary between a superconductor and a metal.

FIG. 2 shows a diagram illustrating the superconducting proximity effect as it occurs at a boundary 27 between a superconductor 26 and a metal 28 susceptible to the proximity effect. A superconducting gap magnitude provides a measure of superconductivity. The superconducting gap magnitude is proportional to the critical temperature and the critical current density in a superconducting material. In the metal the gap magnitude 29 is relatively high close to the boundary 27, and decreases with distance from the boundary. The metal 28 is superconducting close to the boundary 27 due to contact with the superconductor 26. The superconducting gap magnitude in the metal decreases with increasing distance from the boundary 27. The characteristic length of the decay of the superconducting gap magnitude in the metal is the proximity effect decay length.

Figure 3:
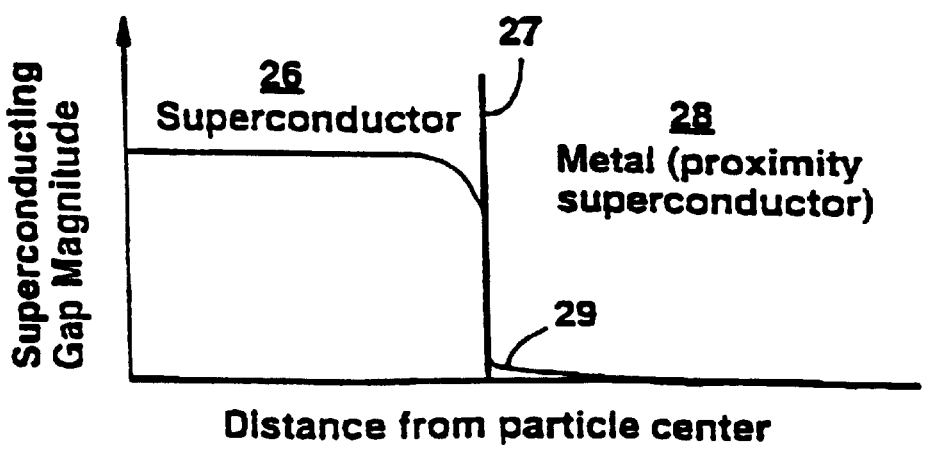
FIG. 3 is a graph illustrating the variation of the superconducting gap magnitude near a boundary between a superconductor and a metal having a low $\lambda$ value.

FIG. 3 shows a diagram illustrating the superconducting gap magnitude in the case where the metal has a low electron-phonon coupling coefficient ($\lambda$ less than 0.2). The gap magnitude 29 in the metal is relatively small, and therefore the metal has relatively small critical current density. The metal has poor superconducting properties due to the low $\lambda$ value. Examples of materials with low $\lambda$ include silver with $\lambda$=0.14, gold with $\lambda$=0.14, and copper with $\lambda$=0.08. These materials are very good conductors, but have poor superconducting properties. Therefore, they are preferably not used as the metal matrix material.

Figure 4:
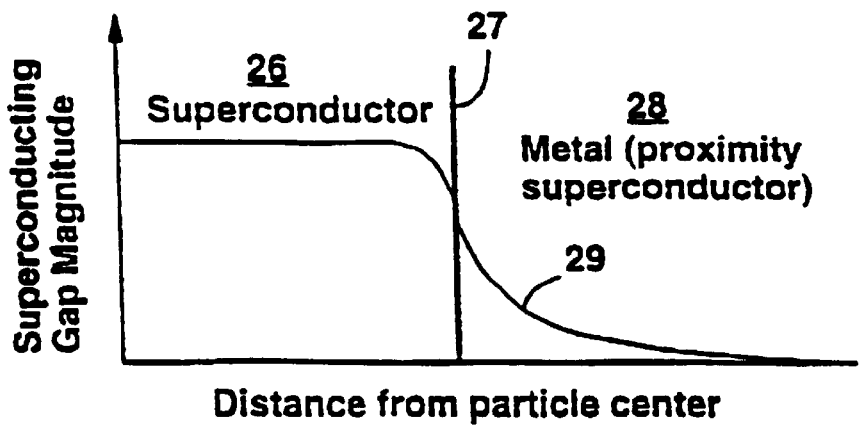
FIG. 4 is a graph illustrating the variation of the superconducting gap magnitude near a boundary between a superconductor and a metal having a high $\lambda$ value.

FIG. 4 shows a diagram illustrating the superconducting gap magnitude in the case where the metal has a high electron-phonon coupling coefficient ($\lambda$ greater than 1.0). The gap magnitude 29 in the metal is relatively large compared to the gap magnitude in FIG. 3. The high $\lambda$ results in the metal having a larger critical current density extending deeper into the metal layer. The proximity decay length of the metal also plays a role.

Figure 5:
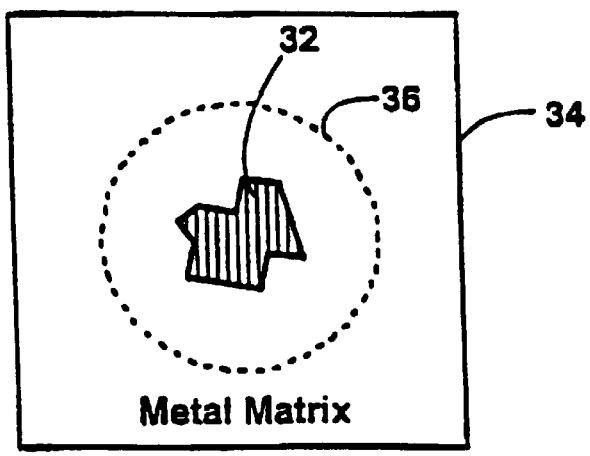
FIG. 5 illustrates the extent of the superconducting proximity effect around a particle of superconducting material disposed within a metal matrix.

In the present invention (e.g., the embodiment shown in FIG. 1), the superconductor particles 22 are superconducting at the operating temperature, and the metal matrix material is induced superconducting through the superconducting proximity effect, even though its superconducting transition temperature may be below the operating temperature. FIG. 5 shows a single isolated superconductor particle 32 disposed in a block 34 of metal matrix material. When cooled below the critical temperature of the particle 32 (but not necessarily below the critical temperature of the metal matrix material block 34), the superconductor particle 32 causes portions of the block close to the superconductor particle to become superconducting due to the proximity effect. Circle 36 illustrates the approximate range of the proximity effect. The circle 36 is relatively large if the metal matrix material has a high $\lambda$ value and long proximity decay length; the circle is relatively small if the metal matrix material has a small $\lambda$ value and/or short proximity decay length. If the metal matrix material block is made of silver, gold, or copper, for example, the circle 36 will extend only a very small distance beyond the surface of the superconductor particle and the block will have essentially no useful superconductivity.

Figure 6:
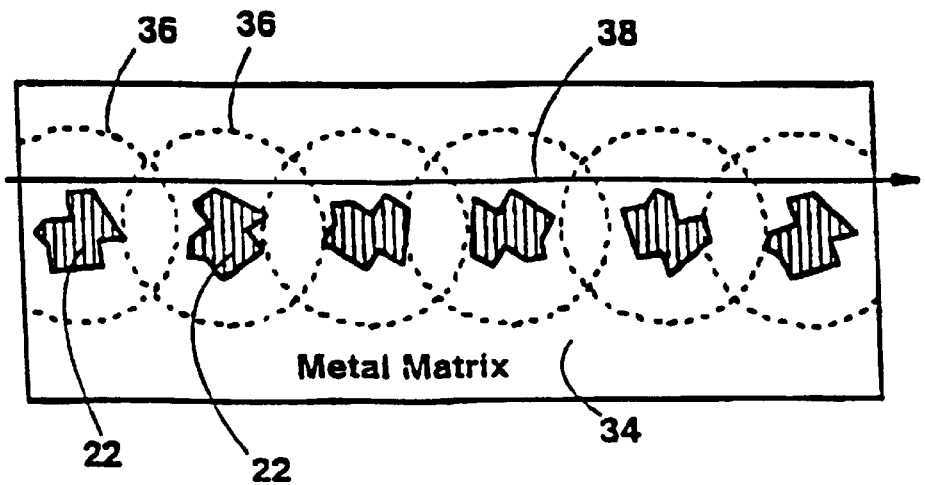
FIG. 6 shows how a number of superconducting particles disposed in a metal matrix provide a continuous supercurrent path through the matrix material.

FIG. 6 shows an idealized embodiment of the present invention in which all the superconductor particles 22 are arranged linearly in the metal matrix material 34. Circles 36 illustrate the approximate range of the superconducting proximity effect within which superconducting gap has a magnitude great enough to provide a useful critical current density. The particles 22 are close enough so that the circles imply that the particles 50 are coupled by a continuous superconducting path due to the proximity effect. The path 38 can pass through the superconductor particles 22 and the superconducting regions of the metal matrix, or can pass only through the superconducting regions of the metal matrix material 34. Very large superconductor particles (with dimensions much greater than the range of the proximity effect) are usually not preferred due to 'voids' in the metal matrix material that were larger than the range of the proximity effect. Generally, the superconductor particles are preferably small enough and numerous enough so that substantially all the metal matrix material is affected by the proximity effect. Of course, the optimum size of the superconductor particles depends somewhat on the volume percent of superconductor particle material versus matrix material, and the temperature at which the composite material is used.

In FIG. 1, the superconductor particles 22 are close enough and numerous enough so that essentially the entire volume of the metal matrix material is induced into a superconducting state by the proximity effect when cooled below the critical temperature of the superconductor particles 22. Therefore, the entire volume of the composite material is superconducting when cooled below the critical temperature of the superconductor particles 22.

An important consideration in the present invention is the relative volume of the superconductor particles and the metal matrix material. The optimal percentages (measured by volume) of superconductor particles and metal matrix material depends greatly on the mechanical and superconducting properties of the materials used, and the desired mechanical and superconducting properties of the composite material. For example, if very high ductility is desired of the composite material, then a high percentage of the very ductile metal matrix material should be used. Generally, the optimal volume percent of metal matrix material increases with increasing $\lambda$.

Also, the temperature at which the composite is to be used has bearing on the composite design. The proximity effect decay length increases with decreasing temperature. Therefore, for a composite used at very low temperatures, the superconductor particles 22 can be located relatively far apart. If the composite is to be used at relatively high temperatures, then the superconductor particles 22 are preferably located relatively close together.

There are many possible combinations (e.g., thousands) of superconductor particle materials and metal matrix materials within the scope of the present invention. Each possible combination may also be improved or optimized by selecting the best superconductor particle volume/matrix material volume ratio. Also, each material combination may be improved or optimized by selecting the best size range for the superconductor particles. Further, there may be special chemical compatibility issues for certain combinations for superconductor particle materials and metal matrix materials. In general, chemical reactivity between the particles and metal matrix material should be avoided, particularly if the reactivity is destructive to the superconducting properties of the superconductor particles, or if the reactivity is destructive to the superconducting properties of the metal matrix material, or if the reactivity degrades the electrical contact between the superconductor particles and the metal matrix (e.g., by producing an insulating layer at the particle/matrix interface).

Figure 7:
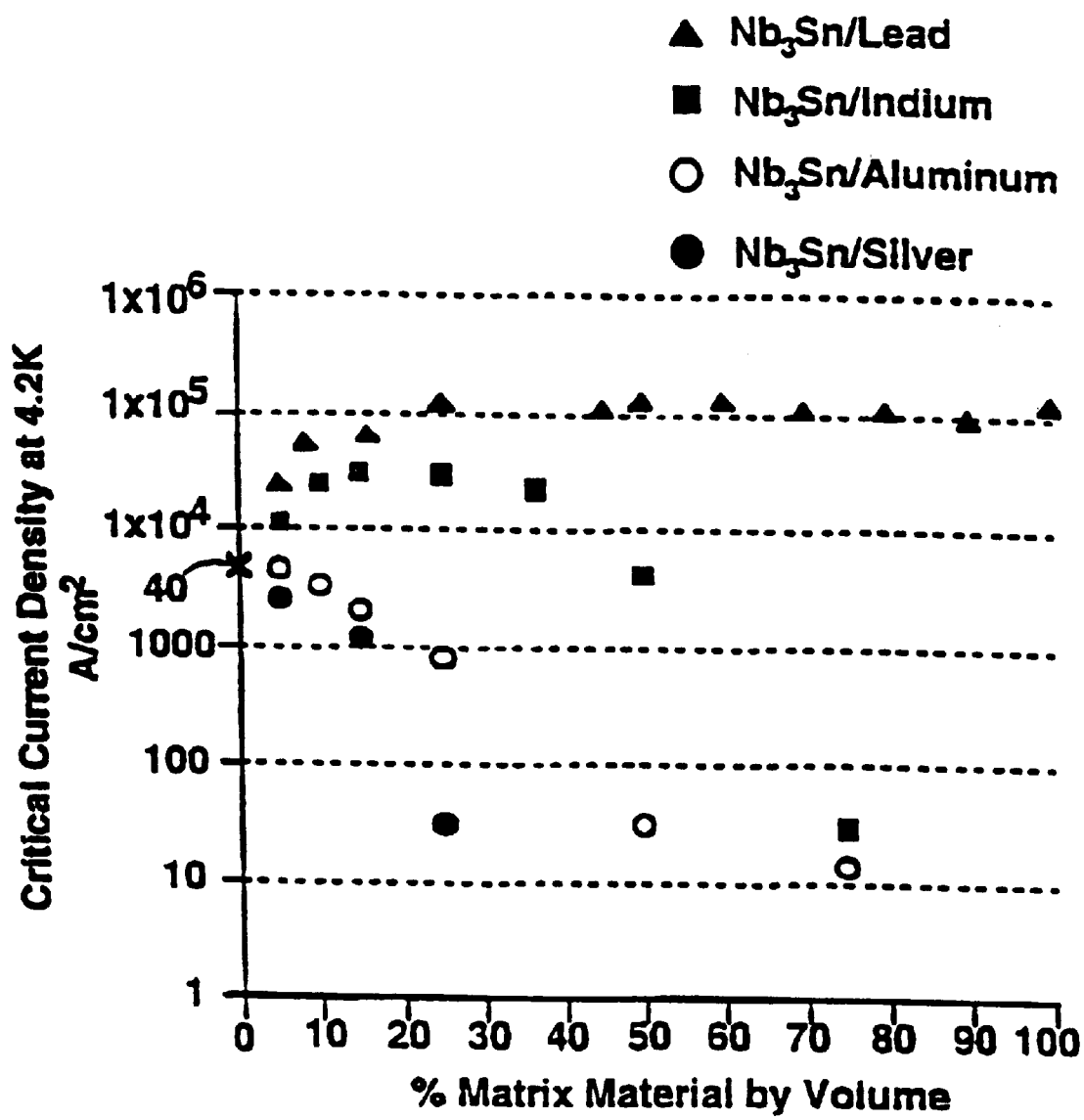
FIG. 7 is a graph of critical current density (Jc) versus volume % matrix material for four different matrix materials (silver, aluminum, indium, and lead), the plot illustrates that high metals are better proximity superconductors than low metals. The ceramic superconductor material used was $Nb_3Sn$.

FIG. 7 shows critical current densities for several different material combinations at 4.2K. The different material combinations are $Nb_3Sn$ superconductor particles dispersed within silver, aluminum, indium and lead. A cross 40 represents the critical current density for pure compacted $Nb_3Sn$ superconductor particles (e.g., a powder-in-tube $Nb_3Sn$ wire). In all the composites represented in FIG. 7, the $Nb_3Sn$ superconducting particles were 325 mesh, which corresponds to particle sizes in the range of about 1–40 microns. It is possible the critical current densities of the composites could be improved by using superconductor particles with more uniform sizes. The critical current density was determined by the standard 0.1 $\mu V/cm$ electric field criterion.

FIG. 7 demonstrates that a composite of $Nb_3Sn$ particles in a silver matrix has a dramatically reduced supercurrent carrying capacity compared to pure compressed $Nb_3Sn$ particles. This is because silver has a very low $\lambda$ and is therefore only very weakly susceptible to the superconducting proximity effect.

Similarly, the composite material which consists of $Nb_3Sn$ superconductor particles embedded in an aluminum matrix has a reduced Jc relative to the pure $Nb_3Sn$ particles because aluminum has a relatively low $\lambda$ of 0.43. However, the composite which consists of $Nb_3Sn$ superconductor particles embedded in an indium matrix has an improved Jc relative to pure $Nb_3Sn$, $Nb_3Sn$/silver, or $Nb_3Sn$/aluminum materials. FIG. 7 indicated that the optimum amount of indium is about 10–35% by volume. Indium improves the Jc of the composite because indium, with a $\lambda$ of 0.81, has relatively high susceptibility to the superconducting proximity effect. Similarly, lead also improves the Jc of the composite because lead, with a $\lambda$ of 1.55, also has a high susceptibility to the superconducting proximity effect. However, embedding the $Nb_3Sn$ superconductor particles in the lead matrix does not improve the Jc as much as would be expected from its $\lambda$ value. This is because the tin (Sn) within the $Nb_3Sn$ tends to offset the Jc improvement provided by the high $\lambda$ of lead. This effect of chemical reactivity is worsened by heating the composite material. Several possibilities for avoiding this effect are discussed below.

FIG. 8 shows critical temperatures (Tcs) for some of the same composite materials plotted in FIG. 7. Bulk $Nb_3Sn$ has a Tc of 18K. However, the Tc of pure compacted $Nb_3Sn$ powder is about 10K, which is indicated in the graph at 42. This low value for Tc reflects the poor inter-particle contact between the $Nb_3Sn$ superconductor particles in a compacted material. FIG. 8 shows that the addition of silver or aluminum to $Nb_3Sn$ particles dramatically decreases the Tc compared to pure compacted $Nb_3Sn$ particles. Aluminum has a Tc of 1.4K and silver is not superconducting at any temperature. By comparison, indium, which has Tc of 3.2K dramatically increases the Tc of the $Nb_3Sn$/indium composite to over 10K. This is a striking result considering that Indium has a Tc less than 10K. Indium increases the Tc of the composite because indium has a relatively high $\lambda$ of 0.81 and is thus quite susceptible to the superconducting proximity effect. Similarly, lead increases the Tc of the $Nb_3Sn$/lead composite because lead has a $\lambda$=1.55. The effect of the high $\lambda$ of lead is offset due to the chemical reactivity between lead and $Nb_3Sn$. It is expected that further increases in the critical temperature of $Nb_3Sn$/lead composites would be realized if not for the dissociation of tin from $Nb_3Sn$ when in the presence of lead.

Figure 9:
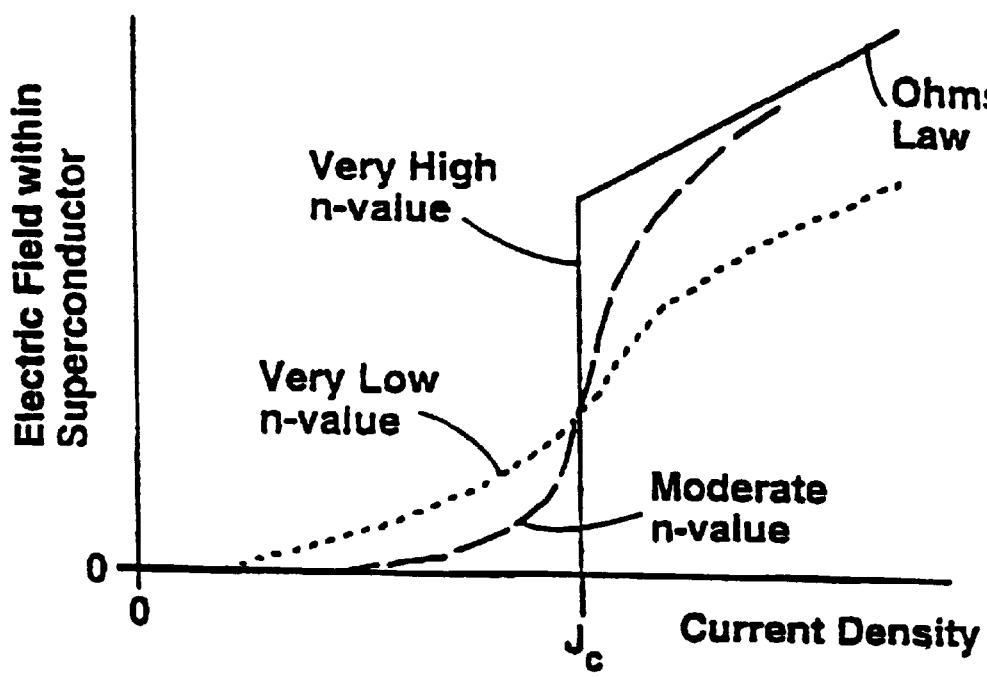
FIG. 9 is a graph of E-field vs. current density, illustrating the meaning of an n-value for a superconducting material, as is known in the art.

The composites of the present invention can be adjusted to have desired 'n-values'. FIG. 9 illustrates the concept of an n-value as is known in the art. The n-value of superconducting material describes the sharpness of the conversion to the normal state when the critical current density is exceeded. Generally, the n-value is defined by the relation.

$$V/Vc = (I/Ic)^n,$$

where I and V are the current and voltage in the wire. Vc is the electric field criterion standard (typically 0.1 $\mu V/cm$), and Ic is the critical current of the composite which is defined as the magnitude of current passing through the composite which results in an electric field of at least Vc existing in the composite. An n-value of 1 corresponds to Ohms Law for a normal resistive metal. The n-value can be an important characteristic for certain superconductor applications. For example, in fault-current limiters for electrical power distribution application, it is highly desirable to have a very high n-value so that power surges are efficiently attenuated. Such devices are operated very close to Ic. A current surge exceeds Ic and pushes the device into normal conduction, thereby absorbing the power surge. The present invention can provide a composite for fault current limiters that have a very high n-value (generally at the expense of a lower Jc or Tc). Conversely, superconducting wire for electric motors should have a relatively low n-value so that large, sudden changes in motor impedance are not produced by current surges and so that changes in motor load do not result in current surges. The present invention provides flexibility so that specific n-values can be provided.

Figure 10:
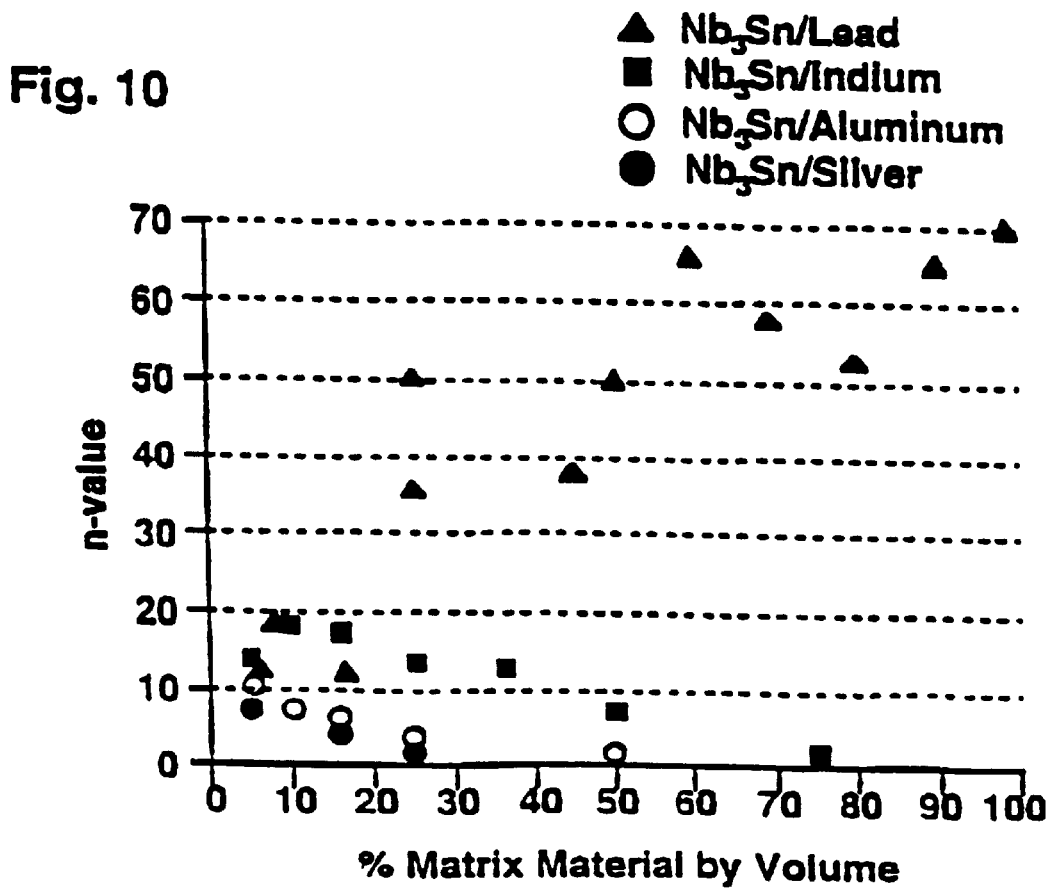
FIG. 10 is a graph of n-value versus volume % matrix material for four different matrix materials (silver, aluminum, indium, and lead)

FIG. 10 plots n-values for several $Nb_3Sn$/metal matrix composites made with silver, aluminum, indium and lead matrix materials. The n-value for a pure compressed $Nb_3Sn$ superconductor particles is about 10. Embedding $Nb_3Sn$ superconductor particles in a matrix of silver or aluminum reduces the n-value compared to pure compressed $Nb_3Sn$ particles. Embedding $Nb_3Sn$ superconductor particles in a matrix of 10–35% indium by volume increases the n-value. Embedding $Nb_3Sn$ superconductor particles in a matrix of lead increases the n-value. The n-value for lead is measured to be about 70. The measured n-values for $Nb_3Sn$/lead composites are not consistent because of variations caused by the reactivity between the $Nb_3Sn$ and lead. Since silver, aluminum, indium and lead have different effect on the n-value, a desired n-value can be produced by using a combination (mixture) of these metals for the matrix material. For example, a combination of lead and silver will produce a wire having a reduced n-value compared to a wire with a matrix of pure lead. By selecting appropriate ratios of different metal matrix materials, a desired n-value is provided.

Figure 11:
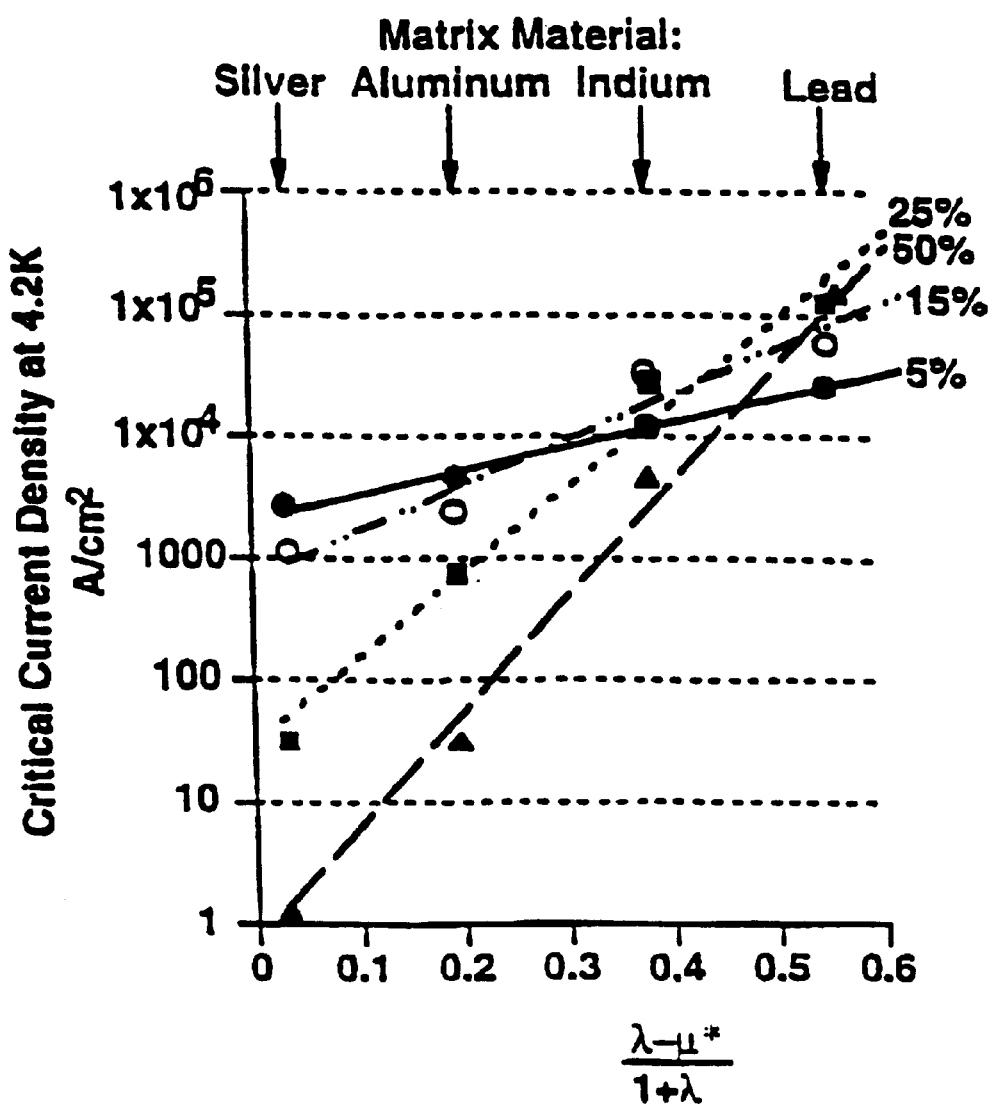
FIG. 11 is a graph of Jc versus normalized electron-phonon coupling constant for different matrix materials.

FIG. 11 shows a graph of the normalized electron-boson coupling constant versus critical current density. The normalized electron-boson coupling constant includes the effect of the screened electron-electron Coulomb repulsion $\mu^*$. For most materials, the screened electron-electron Coulomb repulsion is about 0.1. The normalized electron-boson coupling constant is given by $$(\lambda - \mu^*)/(1+\lambda).$$

The normalized electron-boson coupling constant is proportional to the superconducting gap magnitude in a metal adjacent to a superconductor and therefore is a more accurate measure of proximity effect susceptibility than the electron-boson coupling coefficient $\lambda$. The normalized electron-boson coupling constant values for silver, aluminum, indium, and lead are about 0.03, 0.19, 0.38 and 0.55, respectively. FIG. 11 illustrates that Jc increases strongly with increasing $\lambda$ and normalized electron-boson coupling constant. These results suggest that very high $\lambda$ materials such as lead-bismuth alloys will provide very high Jc's significantly exceeding 100 $kA/cm^2$ if added to the composite in sufficient quantity. Also, these results suggest that, if all other factors are constant, higher normalized electron-boson coupling constants are always better.

FIG. 11 also demonstrates that too much matrix material strongly reduces the Jc of the composite material unless the normalized electron-boson coupling is very high. The higher the normalized electron-boson coupling constant of the matrix material, the more matrix coupling constant of the matrix material, the higher the optimal volume % of matrix material for maximum Jc. In other words, for maximum Jc, matrix materials with higher reduced phonon coupling should comprise higher volume % of the composite material. For matrix materials with $\lambda$ in the range of about 1.5–2, it is estimated that the matrix material should comprise about 25–50% of the composite by volume.

The reaction between lead and $Nb_3Sn$ causes degradation of the superconducting properties of $Nb_3Sn$/lead composites. Also, the superconducting properties are unstable and may deteriorate when the composite is exposed to heat which promotes the reaction. Therefore, $Nb_3Sn$/lead does not provide a good superconducting composite. As noted above, the tin dissociates from the $Nb_3Sn$ and dissolves in the lead.

Generally the A15 compounds tend to be somewhat unstable. If a component of the A15 compound is soluble in the matrix material or binds with the matrix material, then this can promote the dissociation of the A15 compound. For this reason it is best to use A15 compounds having constituents which are insoluble in the metal matrix material or have a low affinity for the metal matrix material. This helps prevent the A15 compound from dissociating and degrading the properties of the composite. For example, if lead is used as a matrix material, other A15 compounds not containing tin can be used.

Most generally, any chemical reactivity between the superconductor particles and metal matrix material should be avoided if it adversely effects the superconducting properties of the superconductor particles, the metal matrix materials, or the superconductor particle/metal matrix interface. In all the embodiments of the present invention, the particles are made of superconducting ceramics. Any metal matrix material that promotes the chemical breakdown of the superconductor particles should be avoided. Lead is an example of the metal matrix material that promotes the chemical breakdown of $Nb_3Sn$.

Figure 12:
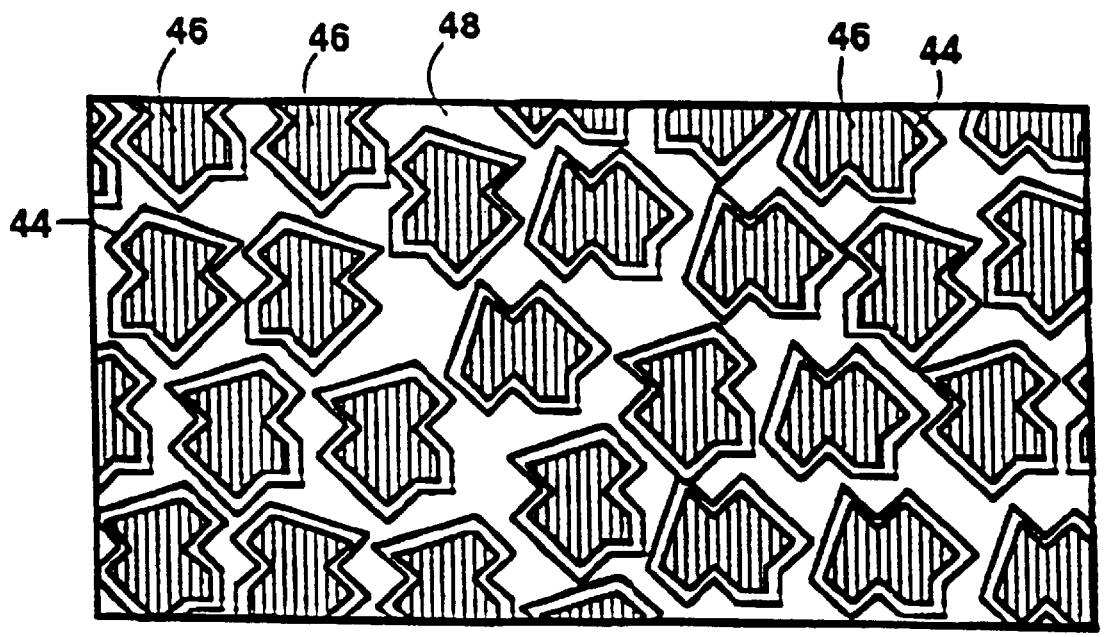
FIG. 12 is a cross-sectional view of an embodiment of the present invention where the superconductor particles are coated with a chemically compatible metal coating to chemically protect the superconductor particles from the metal matrix materials.

FIG. 12 shows an alternative embodiment of the present invention which uses $Nb_3Sn$ superconductor particles 46 and lead as the matrix material 48. Each $Nb_3Sn$ superconductor particle 46 has a thin metal film coating 44 which prevents chemical reactions from occurring between the $Nb_3Sn$ superconductor particles 46 and lead matrix material 48. The coating is chemically compatible with the particles 46 and is chemically compatible with the metal matrix material 48. The coating 44 can be made of many different materials but is preferably metallic and electrically conductive. The coating can be silver, for example. The coating 44 should be thin enough so that the proximity effect from the $Nb_3Sn$ superconductor particles 46 can reach the lead matrix material. This is preferably accomplished by making the coating 44 as thin as possible while still providing chemical isolation between the $Nb_3Sn$ superconductor particles and lead. More specifically, the coating should be substantially thinner than the inelastic electron mean free path (MFP) of the coating material at the temperature that composite material is used (e.g., the critical temperature of the particles). For silver, which does not react with $Nb_3Sn$ the MFP is about 600 nanometers at 18 Kelvin, the Tc for $Nb_3Sn$. More preferably, the coating thickness is less than ½ or ¼ of the electron MFP at the Tc of the superconducting particles.

Preferably, the metal coating is thinner than an electron mean free path in the metal coating material at 4.2 Kelvin. Also, the metal coating is preferably thinner than a proximity effect decay length of the metal coating material at 4.2 Kelvin.

It is noted that metals with a long election MFP tend to have low $\lambda$ values and are therefore are not susceptible to the proximity effect. However, a long mean free path in the coating increases the 'penetration' of the proximity effect through the coating. A coating material with a high λ and short MFP will tend to reduce the proximity effect in the matrix, but in this case the coating itself will be more susceptible to the proximity effect. Generally, if a coating is applied to the superconductor particles, a balance is preferably provided between the coating thickness, electron mean free path, and λ value. For example, a very thick silver coating (much thicker than the silver MFP) would be undesirable because the silver is not susceptible to the proximity effect, and the silver coating would reduce the proximity effect in the matrix. In general, if low λ/high MFP coating is used, it should be as thin as possible while still preventing chemical reactions between the particles and matrix materials. For example, 5–10 nanometers of silver can be sufficient for preventing certain chemical reactions, and the MFP for silver is much greater than 10 nm at temperatures necessary for superconductivity. If a high/low MFP coating is used, the optimal thickness depends on the coating λ and the MFF, as well as the metal matrix material λ.

Table 4 shows several metals which can be used for a metal coating in case where chemical incompatibility exists between the superconductor particles and the metal matrix material. The MFP increases with decreasing temperature. The MFP depends upon the microstructure of the material and so may vary from the values shown (e.g., depending on the process used to make the coating).

TABLE 4

Candidate metal coating metals

| Metal | Inelastic mean free path at 77 Kelvin |
|---|---|
| Silver | 285 nm |
| Gold | 205 nm |
| Aluminum | 131 nm |
| Copper | 328 nm |
| Tin | 100 nm |
| Lead | 141 nm |

FIG. 13 shows experimental results for four composites having $Nb_3Sn$ superconductor particles coated with about 100 nanometers of silver. The coated superconductor particles are disposed in silver, aluminum, indium or lead matrix materials (the silver coating is not considered part of the matrix material). The Jc's for the four composites are indicated by X's. In each of the four composites, the silver coating comprises about 5% of the composite volume. The matrix material (silver, aluminum, indium, or lead) comprises about 15% of the composite volume. The silver coating prevents chemical reactions between the $Nb_3Sn$ superconductor particles. The important point here is the high-λ metals (e.g., indium, lead) increase the Jc of the composite compared to low-λ matrix materials. This is remarkable considering that the matrix is separated from the $Nb_3Sn$ particles by 100 nanometers of silver. The proximity effect extends through the silver coating. If the proximity effect did not extend through the 100 nm silver coating, the Jc for the indium and lead matrix composites would be the same as for the $Nb_3Sn$/silver matrix composite or essentially zero (i.e., less than 10 A/cm²). The fact that indium and lead dramatically increase the Jc while not in direct physical contact with the superconductor particles is proof that the proximity effect extends through the silver coating. It is noted that the silver coating does negatively impact the wire performance somewhat. This negative impact is preferably minimized by reducing the thickness of the silver coating (e.g., to less than 120 nanometers). For example, a silver coating of 100 nanometers is unnecessarily thick, but can be used.

Figure 14:
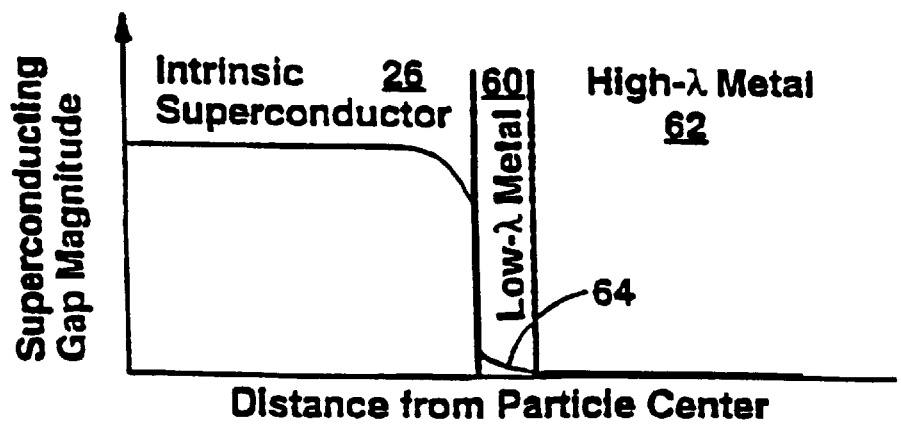
FIG. 14 is a graph illustrating the prevailing, incorrect model of the superconducting proximity effect in a three-layer system.

Prior to the development of the present invention, it was mistakenly assumed by many in the field of superconductivity that the proximity effect could not extend through a thin layer of low-λ metal (such as the noble metals in Table 4). FIG. 14 illustrates the prevailing but incorrect understanding of what was expected in such a 'three-layer' system. The superconductor 26 is separated from a high-λ metal 62 by a thin layer of low-λ metal 60. The low-λ metal has a very small superconducting gap magnitude in the high-λ metal. This model of the proximity effect in the three-layer system is absolutely incorrect.

Figure 15:
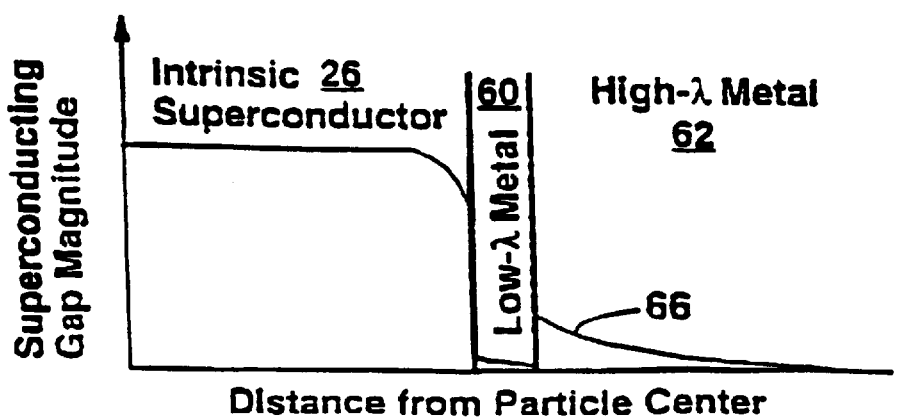
FIG. 15 is a graph illustrating the current model of the superconducting proximity effect in a 3-layer system, as developed by the present inventor.

FIG. 15 illustrates the correct model of the superconducting proximity effect in a three-layer system. Remarkably and surprisingly, the superconducting gap magnitude 66 rebounds in the high-λ metal to a value possibly much higher than the gap magnitude in the low-λ metal 60. The ability of the gap magnitude to rebound in a three-layer system has been confirmed in experiments performed by the present inventor. Of course, in order for the superconducting gap to rebound, the high-λ metal must have a λ substantially higher than the λ of the low-λ metal. The rebounding effect provides the physical basis of operation of the composite materials of the present invention which employ a low-λ metal coating surrounding of the superconductor particles. For example, it is the rebounding effect which provides the improved Jc in the composite material having silver-coated $Nb_3Sn$ superconductor particles in a lead matrix (explained with reference to FIGS. 12 and 13). It is important to note that the low-λ metal is minimized by making the low-λ coating as thin as possible, and by using a low-λ coating with a long MFP.

It is noted that, although the foregoing embodiments of the present invention have been primarily explained with reference to $Nb_3Sn$ as the superconductor particle material, the superconducting particles can be made of many other superconducting compounds and ceramics. Also, the superconducting particles can be made of a mixture of materials (i.e., each superconductor particles within the same composite can be made of different superconducting compounds or ceramics). The choice of superconductor particle material and matrix material is an important one, and depends upon the mechanical, electrical and chemical characteristics of the superconductor particles and matrix materials as well as the desired properties of the composite material (e.g., ductility, critical current density, n-value, critical temperature, chemical reactivity). For many material combination, optimal volume ratios and superconductor particle sizes (e.g., producing the highest Jc, the highest Tc, the highest/lowest n-value, highest ductility) can be found by routine experimentation using the guidance and teaching of the present description.

The composites of the foregoing embodiments are in the form of single filament wire and are simple to manufacture using powder-in-tube methods known in the art. First, a powder of superconducting particles is thoroughly mixed with a metal matrix material. Each constituent material in the composition is preferably clean and free of contaminants. Preferably, the superconductor particles and matrix material are handled in an inert atmosphere. The mixture is placed within a billet such as a copper, silver, aluminum, or rubber tube, though any non-reactive tube will work also. Next, the powder mixture is compressed in the billet, for example using a cold isostatic press. The compression step removes the majority of the voids from the composite material. Optionally, the compression step is performed in vacuum so that the void volume is minimized. Next, the billet containing the fused material is drawn into a wire using known wire drawing techniques. Annealing steps may be required between the drawing steps. It is noted that the typical powder metallurgical techniques may leave voids comprising about 10–20% of the composite volume.

The relative volumes of the superconductor particles and metal matrix material is determined by the amount of the material originally mixed together.

If it is desired to provide the superconductor particles with a noble metal coating (e.g., a silver coating), then this coating is preferably applied before mixing the superconductor particles with the metal matrix material. The coating can be applied using known chemical or physical deposition techniques.

An alternative method for making composite material begins by coating the superconductor particles with a coating of metal matrix material. The thickness of the coating is preferably controlled accurately. The interface between the superconductor particles and the metal matrix material coating is preferably clean and free of grease, oxides and any other insulating contaminants. Next to form a wire from the composite material, the metal matrix coated superconductor particles are placed in the billet, compressed, and drawn into a wire. The relative volumes of the intrinsic superconductor particles and metal matrix material is determined by the size of the superconductor particles and the thickness of the metal matrix material coating. Of course, the composite material of the present invention can be made into any other shape such as bars, rods, sheets, or plates.

A very special set of embodiments of the present invention employ the high temperature superconductor (HTS) ceramic materials (HTS ceramics). In the present specification, HTS ceramics are defined as having a critical temperature greater than 30 Kelvin. Several examples of suitable HTS ceramics are given in Table 5. The HTS ceramic $YBa_2Cu_3O_7$ is preferred for many applications (e.g. wire in high magnetic fields) because of its high flux pinning strength and high Tc.

TABLE 5

Ceramic superconductors

| HTS Ceramic | Critical Temperature, $T_c$ |
| --- | --- |
| $Bi_2Sr_2Ca_2Cu_3O_{10}$ | 105 K. |
| $Bi_2Sr_2CaCu_2O_8$ | 85 K. |
| $(BiPb)_2Sr_2Ca_2Cu_3O_{10}$ | 110 K. |
| $Tl_2Ba_2Ca_2Cu_3O_{10}$ | 125 K. |
| $HgBa_2CaCu_2O_6$ | 135 K. |
| $HgBa_2Ca_2Cu_2O_6$ | 135 K. |
| $Tl_2Ba_2CuO_6$ | 80 K. |
| $La_{1.8}Sr_{0.15}CuO_4$ | 40 K. |
| $Tl_2Ba_2CaCu_2O_8$ | 105 K. |

The HTS ceramics listed above are strong oxidizing agents and will oxidize on contact all but the most noble (nonreactive) metals. Silver, gold, and palladium, for example, are not oxidized by contact with the HTS ceramics. However, these metals have very low electron-phonon coupling coefficients and are not very very poor proximity superconductors. Table 6 lists the electron-phonon coefficients for some noble metals not oxidized by the HTS ceramics.

TABLE 6

Electron-phonon coefficients for some noble metals

| Metal | Electron-phonon coupling, $\lambda$ |
| --- | --- |
| Silver | 0.14 |
| Gold | 0.14 |
| Palladium | <0.10 (approximate) |

Generally, the noble metals have very low electron-phonon coupling coefficients. This explains why prior art composite superconductor wires made with HTS ceramic particles in a silver matrix have relatively low Jc values and are sensitive to mechanical stress. In these wires, the supercurrent tends to flow directly between HTS ceramic particles where they are superconducting). Consequently, supercurrent paths are disturbed when the material is flexed. Silver, gold,.and palladium are very weakly susceptible to the proximity effect due to their very low $\lambda$ values.

If HTS ceramic particles are disposed in a matrix of a non-noble metal (e.g., lead, indium, tin, NbTi or any other metals known to react with the HTS ceramics), an insulating metal oxide coating forms at the interface between the HTS ceramic particles and the non-noble metal. The metal oxide coating almost completely blocks the proximity effects and blocks supercurrent from flowing between adjacent HTS ceramic particles. A composite material having HTS ceramic particles in a matrix of oxidizable metal is almost completely useless as a superconductor due to the insulating metal oxide coating. The oxidizable non-noble metals cannot be combined with HTS ceramic particles in a composite material to make a useful superconducting composite employing the proximity effect.

There is presently no known material that resists oxidation by the HTS ceramics and has a high $\lambda$ (e.g. $\lambda$ greater than 1.0). If such a metal is found or created, it could be combined with HTS ceramic particles in a composite to make a very high quality superconducting composite material with Tc and high Jc.

Figure 16:
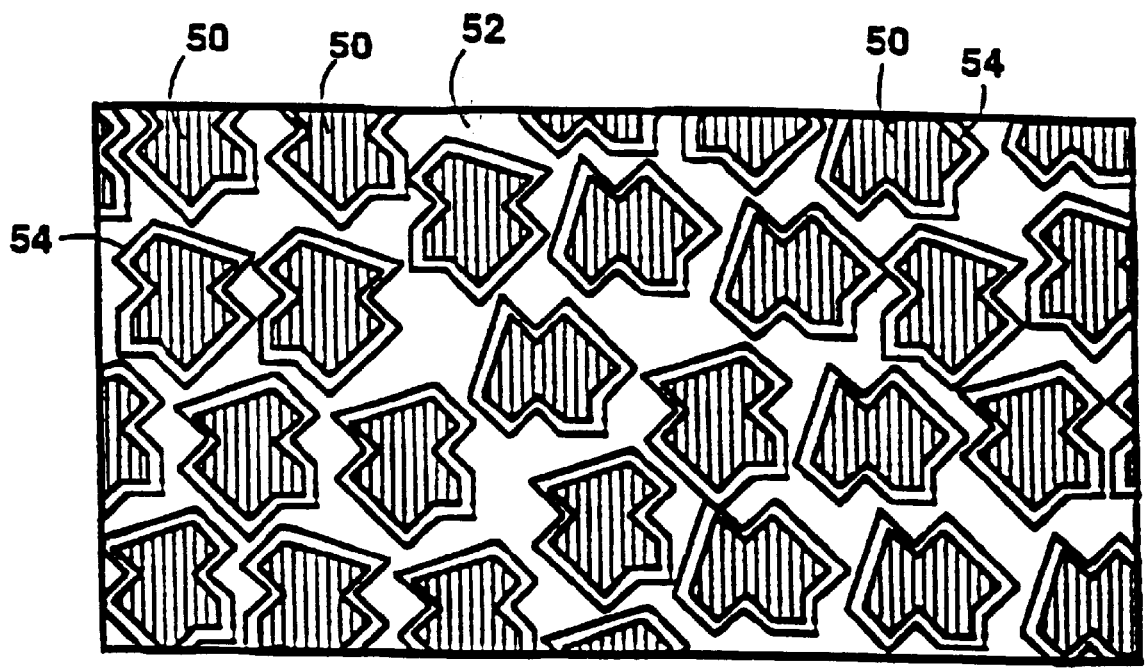
FIG. 16 is a cross-sectional view of an embodiment of the present invention using HTS ceramics as the superconducting particles. The particles are coated with a thin coating of noble metal that is not oxidized by the HTS ceramics particles.

FIG. 16 shows a view of a superconducting composite material according to the present invention that solves the above problems. The superconductor composite material has coated HTS ceramic particles 50 each having a noble metal coating 52. The coating 52 preferably completely surrounds each HTS ceramic particle 50. The noble metal coating 52 is preferably metallic and electrically conductive. The HTS ceramic particles 50 and coating 52 are disposed in a metal matrix material 54. The metal matrix material has a $\lambda$ greater than 0.2, preferably greater than 0.5, more preferably greater than 1.0. All else being equal, the higher the $\lambda$ of the metal matrix material, the better. The metal matrix material 54 is preferably selected from the materials listed in Table 2, although it is understood that Table 2 does not necessarily contain all the useful metal matrix materials. Any metal or metal alloy with a high enough $\lambda$, adequate ductility, and compatible chemical properties is suitable for use as the metal matrix material.

The HTS ceramic particles preferably have dimensions (not including the coating 52) larger than the superconducting coherence length of the HTS ceramic material. Typically, HTS ceramic materials have coherence lengths of about 1.5–3 nanometers, so the HTS ceramic particles preferably are at least this large. The HTS ceramic particles have dimensions of about 5–500 nanometers. Preferably, the HTS ceramic particles have dimensions of about 3–1000 times the superconducting coherence length of the HTS ceramic, or more preferably, about 3–50 times the coherence length. The best size range depends upon the temperature at which the composite material is used, and the λ and proximity effect decay length of the metal matrix material, among other factors.

The noble coating 52 is preferably made of a noble metal that does not react (i.e., is not oxidized) by contact with the HTS ceramic particles.

Preferably, the coating is made of silver, although other metals in Table 6 can be used, as well as alloys of these metals. The metal matrix can include alloys comprising metal s not listed in Table 6. For example, alloys of silver or gold with relatively more reactive metals may be nonreactive with the HTS ceramic. The noble coating 52 serves to prevent chemical reactions (e.g., oxidation) from occurring between the HTS ceramic particles and the metal matrix material 54. The noble coating 52 should be as thin as possible while thick enough to prevent chemical reactions between the HTS ceramic particles and metal matrix material 54. Preferably the noble coating is about 5–50 nanometers thick, but the noble metal coating can also be as thick as 3000 nanometers. Thick noble coatings negatively impact or adversely affect the superconducting properties (e.g., Jc, Tc) of the composite superconducting material.

Silver is the preferred noble metal because it is the least expensive of the metals not oxidized by contact with HTS ceramics. Silver is also preferred because silver oxide is unstable at the modest temperatures used to anneal the HTS ceramic material, further inhibiting the formation and persistence of an oxide layer.

Also, silver is permeable to oxygen at elevated temperature. This is beneficial because the HTS ceramics require a high oxygen content for superconductivity. If oxygen is depleted from the HTS ceramic material, superconductivity is degraded. HTS ceramic particles coated with silver can be replenished with oxygen because silver is permeable to oxygen at elevated temperature. The oxygen content of coated HTS ceramic particles is restored by heating the coated particles in an oxygen atmosphere.

Preferably, the noble metal coating is thinner than the inelastic electron mean free path (MFP) in the noble metal at the critical temperature of the superconducting particles. More preferably, the metal coating is thinner than ½ or ¼ of the electron MFP of the coating at the critical temperature of the superconducting particles.

A long MFP allows electrons and holes from the HTS ceramic particles to travel a long distance in the noble metal. This increases the probability that electrons and holes will reach the metal matrix material without collisions and thereby provide a substantial superconducting gap magnitude in the metal matrix material. Silver is also preferred because of its relatively long MFP. Again, it is emphasized that the noble metal coating should be as thin as possible while still providing chemical isolation for the HTS ceramic particles.

Also, it is preferable for the noble metal coating to be thinner than the proximity effect decay length of the noble metal at the critical temperature of the superconducting particles. Proximity effect decay lengths are typically shorter than the MFP for noble metals, and the proximity effect decay length is inversely proportional temperature. The proximity effect decay length is determined by the rate of dephasing of electron and electron-hole wave functions in the noble metal. The dephasing is caused by differences in the electron and hole velocities. The proximity effect decay length is known and understood in the art. Table 7 gives the proximity effect decay lengths for some noble metals 77 Kelvin.

TABLE 7

Proximity effect decay lengths for some noble metals

| Noble Metal | Proximity effect decay length at 77 K. |
|---|---|
| Silver | 22 nm |
| Gold | 22 nm |
| Palladium | 27 nm |

Figure 17:
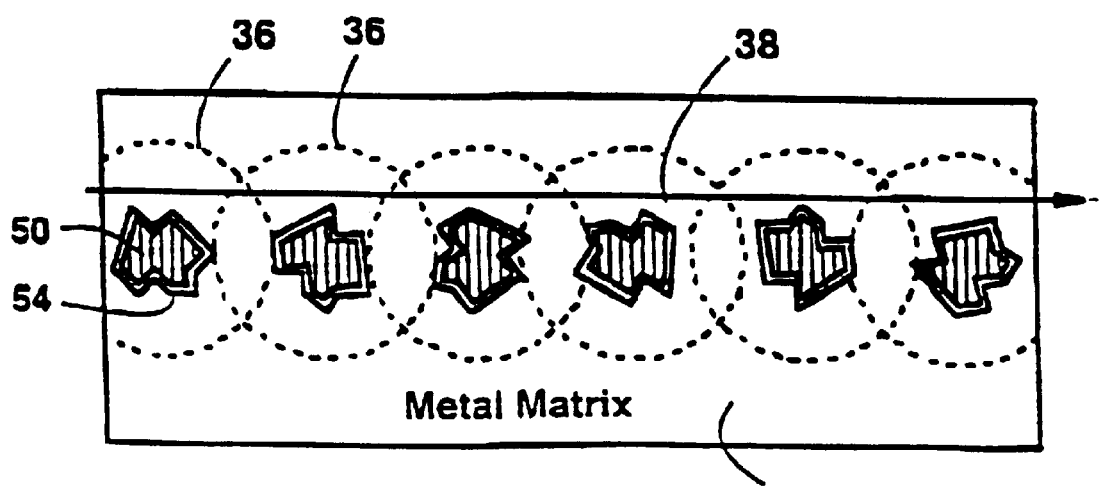
FIG. 17 illustrates how the embodiment of FIG. 16 provides a continuous supercurrent path through the matrix material.

FIG. 17 illustrates the operation of the embodiments employing HTS ceramic particles 50 with a noble metal coating 54. When cooled below the HTS ceramic Tc, a proximity effect extends into the metal matrix material 52 a certain range illustrated by the circles 36. It is understood that the proximity effect extends through the noble metal coating 54 and into the metal matrix material 52 according to the model explained with reference to FIG. 15. The superconducting gap rebounds in the metal matrix material 52. The proximity effect decays with distance from the HTS particles 50 so that the circles provide an arbitrary measurement of the proximity effect range. The particles 50 are close enough together so that the circles 36 overlap, thereby providing a continuous supercurrent path 38. The overlapping circles means that the particles 50 are coupled by the continuous superconducting path due to the proximity effect. Circle size increases with decreasing noble metal coating thickness.

A method for preparing the HTS ceramic composite superconductor material begins with providing clean HTS ceramic particles of appropriate sizes. The HTS ceramic particles are then coated with a thin uniform coating of noble metal, preferably silver. Silver can be deposited using a number of techniques known in the art such as chemical deposition and vapor deposition. Vapor deposition can be performed by sifting the particles in a vacuum chamber having a partial pressure of silver, for example. Other techniques for forming the noble metal coating are known in the art.

After the HTS ceramic particles are coated with silver, the interior of the HTS ceramic particles can be replenished with oxygen. Replenishment is performed by heating the coated particles in an atmosphere with a partial pressure of oxygen. Since silver is permeable to oxygen at elevated temperatures (300° C. and up), oxygen reaches the ceramic. The best temperature, oxygen pressure, and annealing time is specific to each HTS ceramic and is selected to optimize the superconducting properties of each ceramic. Such annealing techniques for silver coated high Tc ceramics are well known in art. The coated HTS ceramic particles are then thoroughly mixed with particles of the metal matrix material. The ratio of HTS ceramic particles to metal matrix material particles determines the average spacing between the HTS ceramic particles. The mixing ratio has a large effect upon the superconducting properties of the composite material and should be optimized for a particular application. To form the composite into a wire, the mixture is then disposed in a metal billet and compressed to fuse the mixture into a densely packed composite material. Compression may be performed under vacuum so that void space is minimized. The densely packed composite material is then drawn into a wire using conventional techniques. Of course, the ceramic particles and metal matrix particles can be compressed to form any other shape such as bars, rods, sheets, or plates.

Alternatively, the coated HTS ceramic particles are coated with the metal matrix material. The twice coated HTS ceramic particles are then compressed in a billet and drawn into a wire.

The present invention provides a new class of superconducting composite materials that are designed to maximize the superconducting proximity effect. The metal matrix material is selected based on its electron-phonon coupling coefficient $\lambda$, and its chemical compatibility. In cases where a chemical incompatibility exists between the intrinsic superconductor particles and the metal matrix material (as in the case of the HTS ceramics and the $Nb_3Sn$/lead combination), a noble metal coating protects the superconductor particles. In the case of the HTS ceramics, the metal coating is preferably a noble metal coating that resists oxidation. For many other superconductor particles, the coating can be any metal compatible with other materials in the composite. If the metal coating is thin enough, and has a long enough MFP, the proximity effect causes the surrounding metal matrix material to become superconducting due to the proximity effect.

It is noted that the present invention includes many possible combinations of superconductor particles materials and metal matrix materials. Any ceramic superconductor particles can be combined with any high-$\lambda$ metal matrix material. If a chemical incompatibility exists in the combination (e.g. the combination causes degradation of the superconductor particles or degradation of the metal matrix material, or an insulating coating forms at the superconductor particle/metal matrix interface), then a chemically-insulating, electrically conductive coating should be provided between the superconductor particles and the metal matrix material. The coating is preferably a noble metal if the ceramic particles are highly reactive, such as many of the HTS ceramics.

For superconductor particle materials that are less reactive than the HTS ceramics, the coating can be made of high $\lambda$ metals that are readily oxidizable. However, the coating is preferably non-reactive with the particles and the metal matrix material.

The present invention is not limited to the superconductor particle material and metal matrix materials listed herein.

It is not necessary in the present invention to only select materials that do not react at all with one another. A certain amount of reactivity can be tolerated between the different components if the reactivity does not significantly damage the superconducting properties of the composite. For example, $Nb_3Sn$/lead composite demonstrates some amount of damaging reactivity, but, $Nb_3Sn$/lead composite is still useful as a superconductor for certain applications and is within the scope of the present invention. The present invention covers any material combinations that do not destroy superconductivity in one of the material components, or does not form electrically insulating layers (e.g., metal oxides) at interfaces between the components.

Wire Manufacture

FIG. 18 to FIG. 25 illustrate how the materials hereinbefore described can be used in manufacturing a three-component wire, according to an embodiment of the invention.

Figure 18:
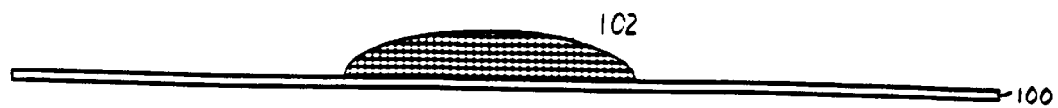
FIG. 18 is a side view of a sheet of protective material with superconductor particles in granular form deposited thereon.

Referring firstly to FIG. 18, a sheet 100 of ductile protective material is provided on which superconductor particles 102 are deposited. The sheet 100 may for example be made of any one of the materials listed in Table 3. The sheet 100 is initially relatively thick for ease of handling and to prevent tearing thereof. The sheet 100 may for example, be made of silver having a thickness of about 0.05 mm. The superconductor particles 102 are in granular form and can be made of any one of the HTS materials listed in Table 5.

Figure 19:
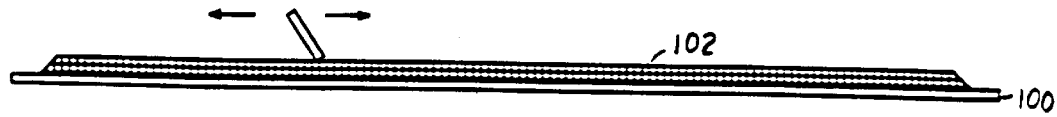
FIG. 19 is a view similar to FIG. 18 wherein the superconductor particles are spread over the sheet.
Figure 20:
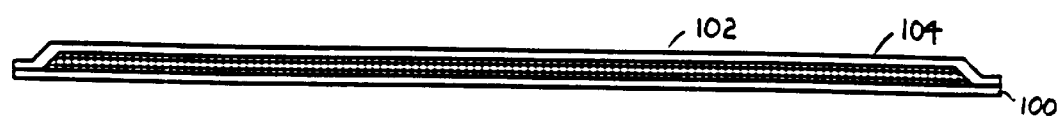
FIG. 20 is a view similar to FIG. 19 after another sheet of protective material is located on the superconductor particles.

As shown in FIG. 19, the superconductor particles 102 are spread evenly over a surface provided by the sheet 100. In FIG. 20, another sheet 104 of the same material as the sheet 100 is located over the superconductor particles 102. The sheet 104 typically has the same thickness as the sheet 100. The superconductor particles 102 are thereby located between the sheets 100 and 104 of protective material.

Figure 21:
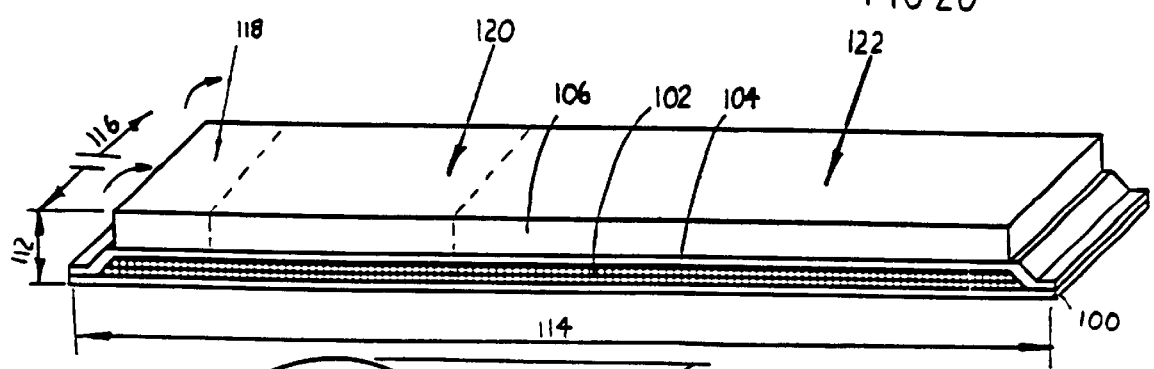
FIG. 21 is a perspective view of a composite sheet which is formed after a sheet of conductive material is located on the top protective sheet of FIG. 20.

Next, as shown in FIG. 21, a sheet 106 of ductile conductive material is located on the sheet 104 of protective material 104. The sheet 106 may be made of any one of the materials in Table 2. The sheet of protective material 100, the superconductor particles 102, the sheet of protective material 104, and the sheet of conductive material 106 thereby form four layers of a composite sheet 110. The composite sheet 110 has a thickness 112, a width 114, and a length 116 (only a portion of which is shown). The thickness is typically about 1 cm, the length 112 about 1 m, and the width 114 about 20 cm.

Figure 22:
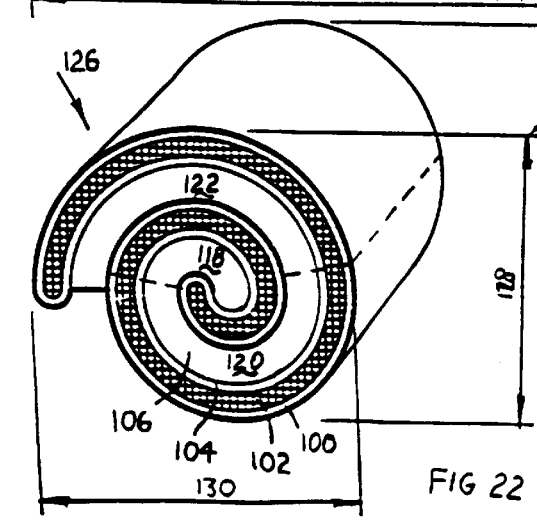
FIG. 22 is a perspective view of an elongate member that is formed by folding, or rolling the composite sheet of FIG. 21.

The composite sheet 110 has a strip 118 at an edge thereof extending along the length 116 thereof. Another strip 120 is located next to the strip 118, also extending along the length 116, and a further strip 122 is located next to the strip 120, the strip 122 also extending along the length 116. The strip 118 is folded on to the strip 120. The strip 118 is thereby located on top of the strip 120. Folding of the strip 118 onto the strip 120 is allowed for due to ductility of the sheets 100, 104, and 106, and due to the superconductor particles 12 being in singulated granular form. The strip 118 is then folded onto the strip 122 so that the strip 118 is located between the strip 122 and the strip 120. The strips 118, 120, and 122 being folded or rolled onto one another are shown in FIG. 22. Once folded, the composite sheet 110 forms an elongate member 126 having a length 116, a height 128, and a width 130. The height 128 is about 4 cm and is substantially the same as the width 130. Because of folding of the composite sheet 110, the elongate member 126 has a height 118 and a width 130 which are smaller than the width 114 of the composite sheet 110. It should be understood that, although the composite sheet 110 is rolled in the embodiment described, other methods of forming the composite sheet 110 may provide a similar elongate member. The composite sheet 110 may for example, be fan-folded.

The components of the elongate member 126 are located relative to one another so that the superconductor particles 102 are located next to the conductive material 106 on one side thereof and located next to the conductive material 106 on opposing side thereof. The conductive material 106 on each side is separated from the superconductor particles 102 by a respective portion of either the sheet 100 of protective material or the sheet 104 of protective material.

Figure 23:
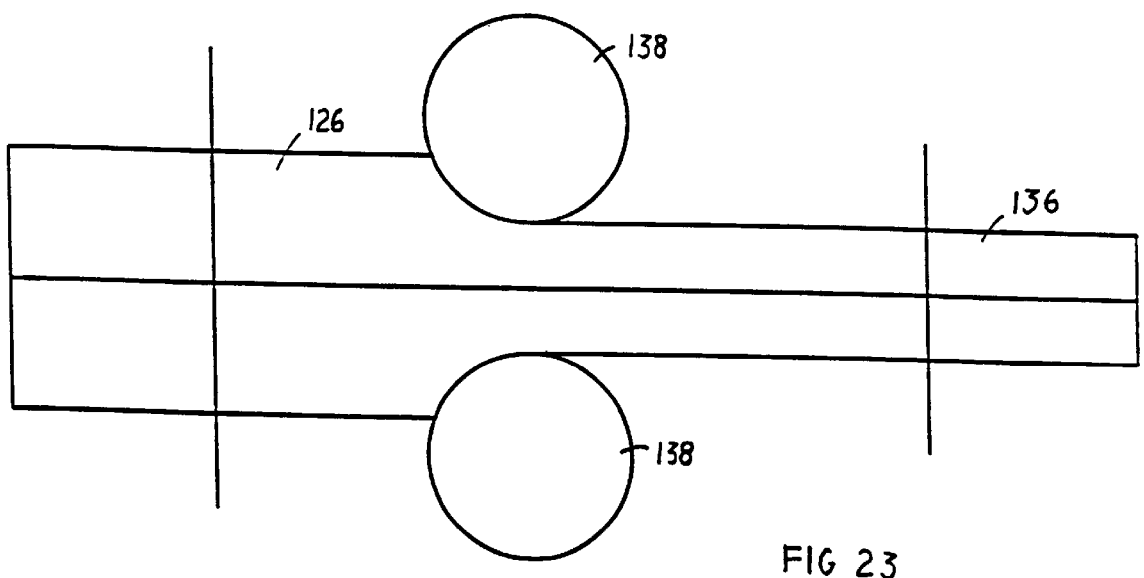
FIG. 23 is a side view illustrating how the elongate member of FIG. 22 is rolled into a wire.
Figure 24:
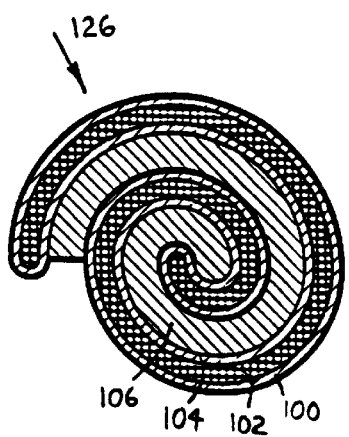
FIG. 24 is a cross-sectional view of the elongate member before being rolled.
Figure 25:
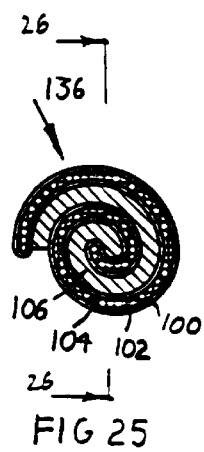
FIG. 25 is a cross-sectional view of the wire after being rolled.

FIG. 23 illustrates further processing of the elongate member 126 wherein the elongate member 126 is rolled into a wire 136. The elongate member 126 is rolled by rollers 138 and other known equipment which reduce the dimensions of the elongate member 126 with a corresponding increase in length thereof. FIG. 24 is a cross-section of the elongate member 126 and FIG. 25 is a cross-section of the wire 136. As mentioned previously, the sheets 100 and 104 are initially relatively thick. Once the dimensions of the elongate member 126 are reduced to form the wire 136, the sheets 100 and 104 also reduce in thickness. The thickness of the sheets 100 and 104 of the wire 136 are about ten times the decay length of the material thereof. The superconductor particles 102 can induce the conducting material 106 to a superconductive state through the sheet 100 or. 104. The exemplary 1 m by 4 cm elongate member 126 may for example be drawn into wire 136 having a diameter of 1 mm, a length of 1.6 km and have sheets 100 and 104 of silver that are reduced to 0.05 mm in thickness.

Figure 26:
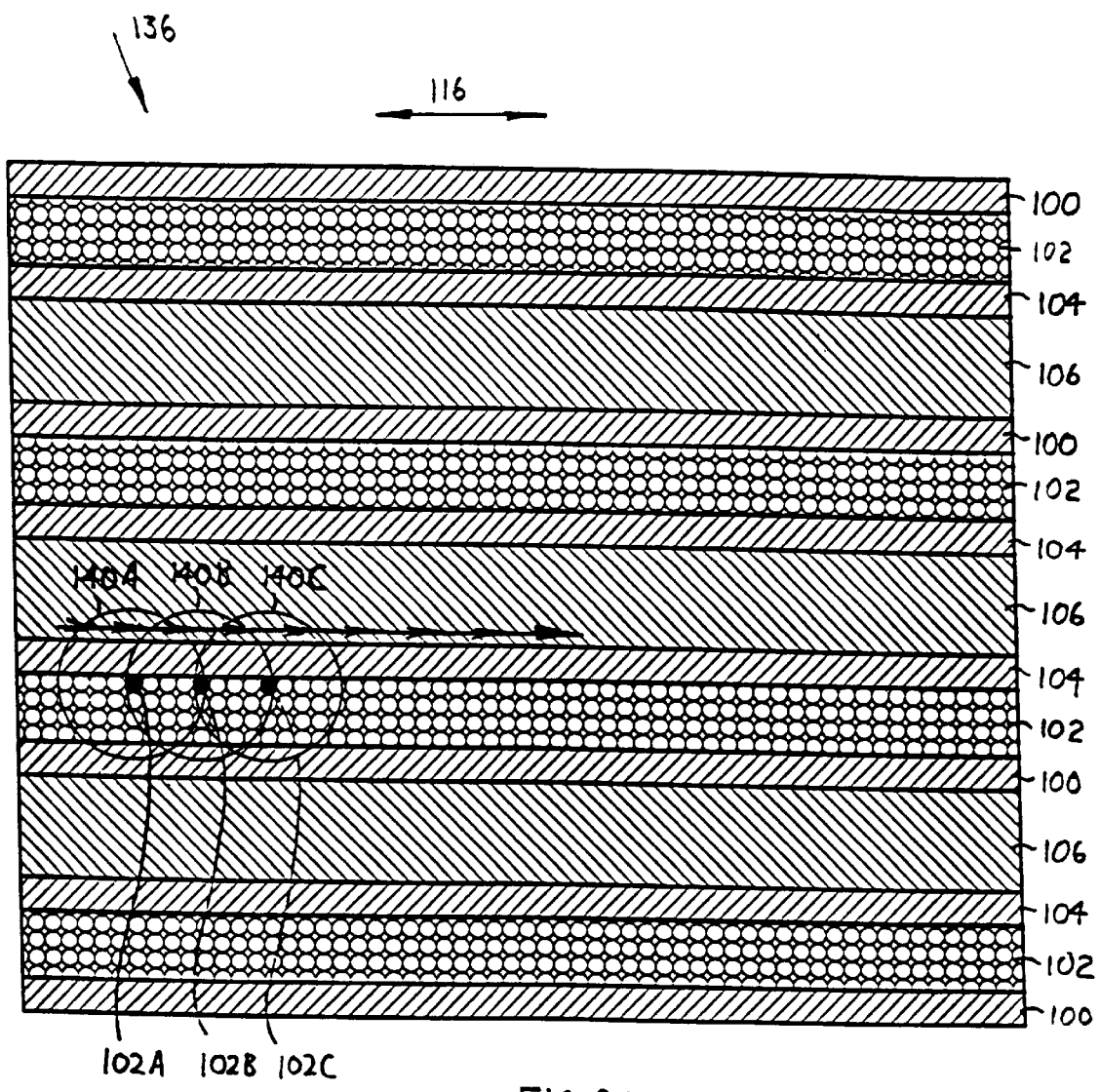
FIG. 26 is a cross-sectional view on 26—26 of the wire in FIG. 25 illustrating how the conductive material is induced to a superconductive state by the superconductor particles.

FIG. 26 is a cross-sectional view on 26—26 of FIG. 25. It can be seen that the sheets 100, 104, and 106, and the superconductor particles extend continuously through the wire 136. FIG. 26 only shows a section of the wire 136 but it should be understood that the wire 136 may be kilometers long with a continuous construction as shown in FIG. 26. It should, in particular, be noted that the conductive material 106 extends through continuous kilometers of the wire 136.

A respective superconductor particle 102A induces a region of the conductive material 140A to a superconductive state through the sheet 100. Another superconductor particle 102B induces another region 140B in this conductive material 106 to a superconductive state. The region 140B overlaps the region 140A, thereby providing a superconductive link from the region 140A to the region 140B. In a similar manner, another superconductor particle 102C induces another region 104C of the conductive material 106 to a superconductive state, and subsequent regions are also induced to a superconductive state. The regions overlap one another so that an unbroken superconductive path in the conductive material 106 is provided through the entire length of the wire 136. The wire 136 can thus conduct current in a superconductive nature when the wire 136 is cooled to an appropriate temperature wherein the superconductor particles 102 are superconductive.

The embodiment described with reference to FIG. 18 to FIG. 26 is for a three-component wire including (i) an HTS superconductor material from Table 5, (ii) a conductive material from Table 2, and (iii) a sheet of protective material from Table 3 located between the HTS superconductor material and the conductive material. Such a wire allows for the proximity effect to be employed utilizing a reactive or brittle HTS superconductor material.

Figure 27:
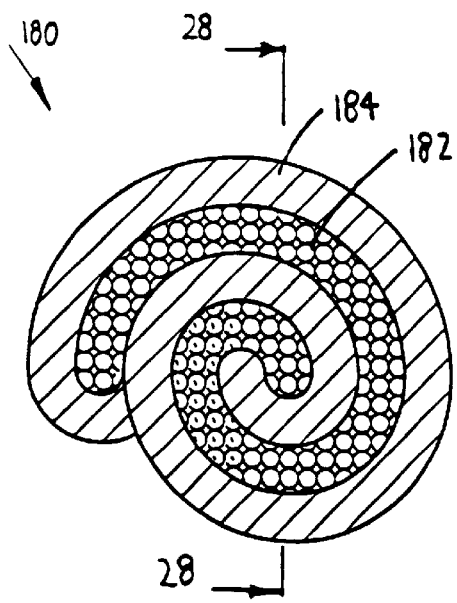
FIG. 27 is a cross-sectional view illustrating a two component wire that is made according to a method similar to that of FIG. 25.

In another embodiment an intrinsic superconductor material from Table 1 can be used together with a conductive material from Table 2. The intrinsic superconductor materials of Table 1 have the advantage that they are not as reactive as HTS superconductor materials, so that a wire embodiment of an intrinsic superconductor material and a conductive material can be formed without a sheet of protective material between the intrinsic superconductor material and the conductive material. Such a wire is shown in FIG. 27 and can be formed by spreading particles 182 of brittle superconductor material over a sheet 184 of ductile conductive material and then folding or rolling the sheet 184 of conductive material into an elongate member so that the particles 182 of superconductor material are trapped between successive layers of the sheet 184 of ductile material, whereafter the elongate member is drawn into the wire 180. The wire 180 requires fewer components while still having a conductive material with an electron-phonon coupling coefficient of at least 0.2.

Figure 28:
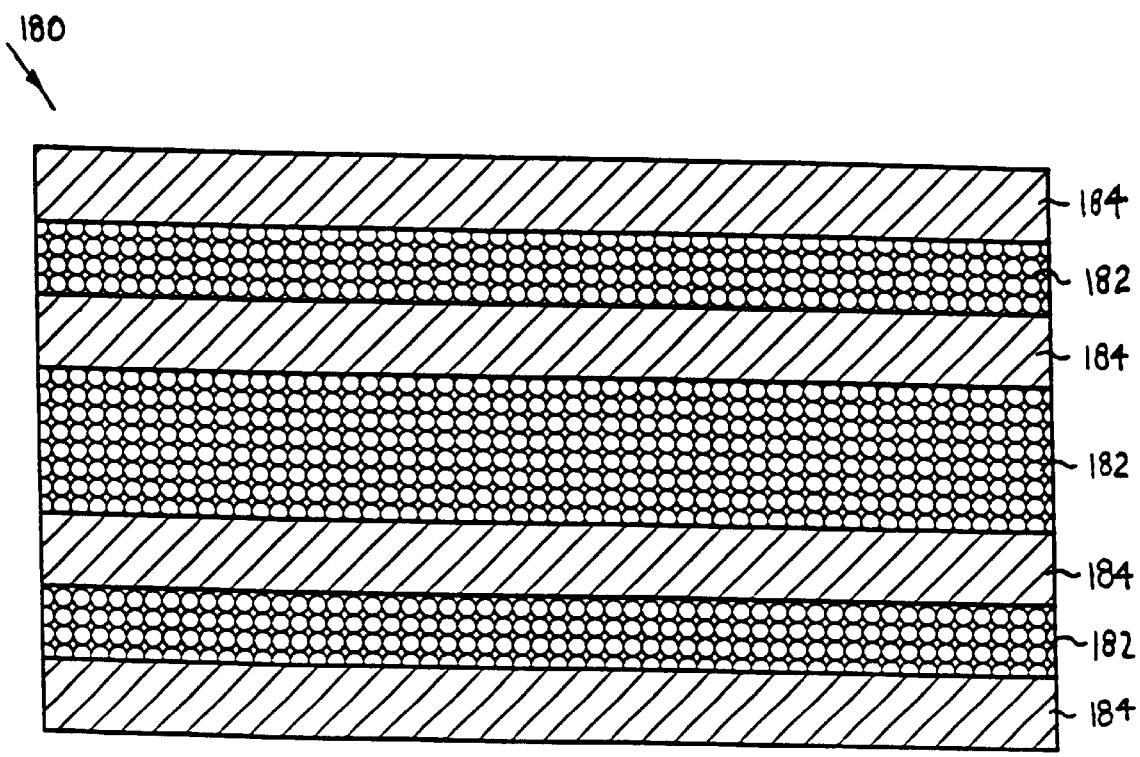
FIG. 28 is a cross-sectional view on 28—28 of the wire of FIG. 27.

FIG. 28 is a cross section on 28—28 in FIG. 27. It can be seen from FIG. 28 that the particles 182 of superconductor material are located directly against the sheet 184 of conductive material. The conductive material of the sheet 184 is driven to a superconductive state by the superconductor particles 182 without a protective sheet located between the particles 182 and the sheet 184.

FIG. 29 to FIG. 37 now illustrate three different embodiments of making three-component powder-in-tube wire from the HTS materials listed in Table 5 the protective materials listed in Table 3, and the conductive materials listed in Table 2, and FIG. 38 to FIG. 43 illustrate two embodiments of making a two-component powder-in-tube wire utilizing the intrinsic superconductor materials of Table 1 and the conductive materials of Table 2.

Figure 29:
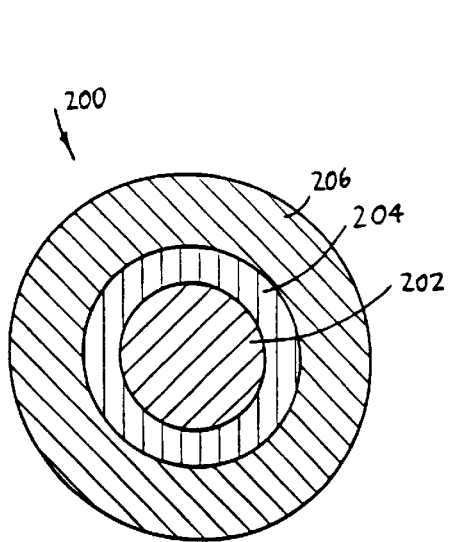
FIG. 29 is a cross-sectional view of a three-component granule used for powder-in-tube manufacture of wire.
Figure 30:
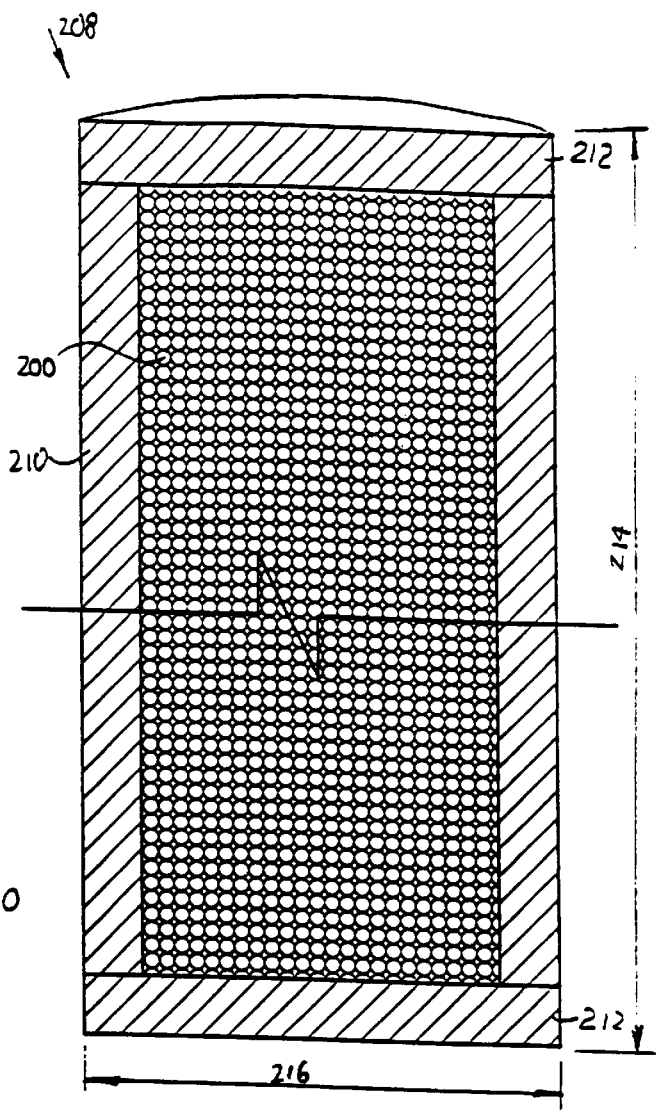
FIG. 30 is a cross-sectional view of an elongate member which is symbolizing a plurality of the granules of the FIG. 29.
Figure 31:
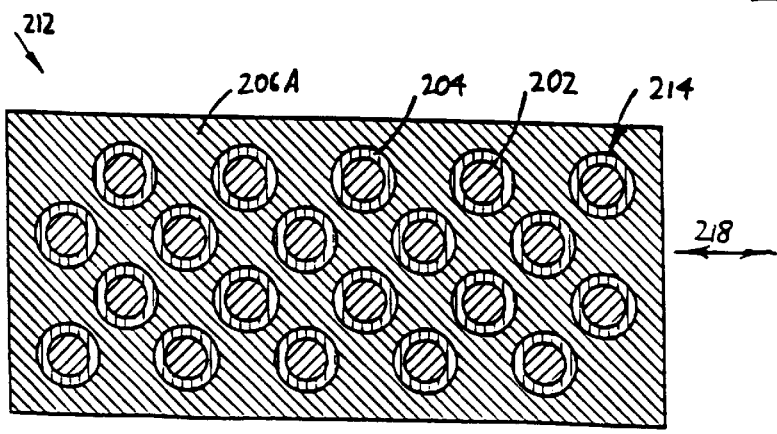
FIG. 31 is a cross-sectional view of wire being rolled from the elongate member of FIG. 30.

The first embodiment of making a three-component powder-in-tube wire is shown in FIG. 29 to FIG. 31. FIG. 29 shows one granule 200 that is used in the manufacture of the wire. The granule 200 includes a superconductor particle 202, a layer of protective material 204, and a layer of conductive material 206. The superconductor particle 202 may be made of any one of the materials in Table 5. The layer 204 is formed directly on the superconductor particle 202 and entirely surrounds the superconductor particle 202. The layer 204 may be made of any one of the materials in Table 3. A layer 206 is formed directly on and entirely surrounds the layer 204. The layer 206 may be made of any one of the materials in Table 2.

FIG. 30 illustrates an elongate member 208 that is used for rolling wire out of. The elongate member has a circular pipe container 210 that is filled with a plurality of the granules 200. End caps 212 close off opposing ends of the pipe container 210. The elongate member 208 has a length 214, a width 216, and a height into the paper. The height and the width substantially equal one another. The layers 206 of conductive material of the granules 200 contact one another when located within the pipe container 210. The elongate member 208 is drawn in to a wire in a manner similar to that shown in FIG. 23. Drawing of the elongate member 208 into wire causes a reduction in the width 216 and the height with a corresponding increase in the length 214. The elongate member 208 initially has dimensions similar to the elongate member 126 in FIG. 22 and drawn into wire having dimensions similar to the wire 136 of FIG. 25.

FIG. 31 illustrates a core of wire 212 that is drawn out of the elongate member 208. The layers 206 of the granules 200 of FIG. 29 are deformed so that they fill regions between the superconductor particles 202. What remains of the initial granules 200 are a plurality of coated particles 214 with each coated particle 214 including a respective superconductor particle 202 and a respective layer 204 of protective material. The layers 206 of conductive material forms a matrix 206A filling regions between the coated particles 214. Deformation of the conductive layer 206 is allowed for due to ductility of the material that they are made of. A respective superconductor particle 202 induces or drives a respective region of the matrix material 206A surrounding the respective superconductor particle 202 to a superconductive state. A respective region given to a superconductive state by one of the superconductor particles 202 overlaps another region given to a superconductive state by another superconductor particle 202 so that a superconductive link is created from the one region to a next region. These regions overlap one another along an entire length 218 of the wire 212. A continuous chain of regions that are driven to a superconductive state is thereby created along the entire length 218 of the wire 212, which may be kilometers long.

FIG. 32 to FIG. 34 illustrate a second embodiment of making a three-component powder-in-tube wire according to the invention. FIG. 32 illustrates a granule 230 including a superconductor particle 232 and a layer 234 of protective material. The superconductor particle 232 is made of a material from Table 5 and the layer 234 is made of a material from Table 3. FIG. 33 shows an elongate member 236 assembled from an elongate pipe container 238 with a plurality of the granules 230 therein. Opposing ends of the pipe container 238 are closed with end caps 240. The pipe container 238 is made of a material from Table 2.

FIG. 34 illustrates a portion of a wire 242 that is drawn from the elongate member 236. The material of the protective layers 234 of the granules 238 is sufficiently ductile so as to deform into a matrix 234A that fills spaces between the superconductor particles 232. The pipe container 238 is also sufficiently ductile so as to deform into a casing 238A that entirely surrounds the matrix material 234A and the superconductor particles 232. The superconductor particles 232 located closest to an inner wall of the casing 238A are spaced from the inner wall of the casing 238A by a respective portion of the matrix 234. The superconductor particles 234 are however sufficiently close to the casing 238A so as to drive respective regions of the material of the casing 238A to a superconductive state. These regions overlap one another so as to form a continuous chain of superconductive regions extending throughout the wire 242.

Figure 35:
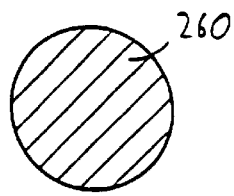
FIG. 35 is a cross-sectional view of a superconductor particle having exposed outer surfaces.
Figure 36:
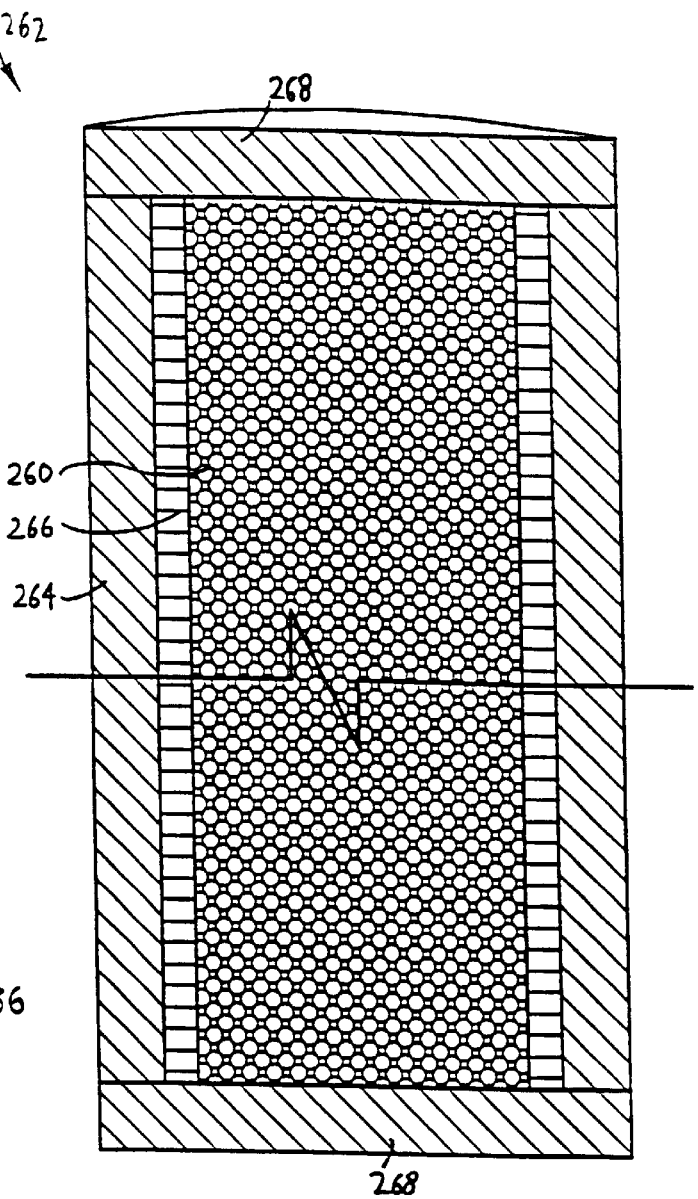
FIG. 36 is a cross-sectional view of an elongate member that is assembled from a plurality of the superconductor particles of FIG. 35 and other components for purposes of making wire according to a three-component powder-in-tube method.
Figure 37:
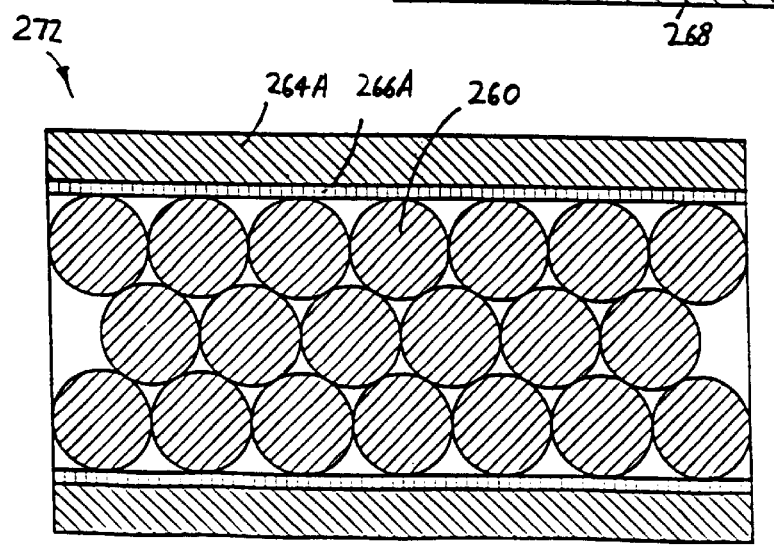
FIG. 37 is a cross-sectional view of a wire that is drawn from the elongate member of FIG. 36.

FIG. 35 to FIG. 37 illustrate a third embodiment of making a three-component powder-in-tube wire according to the invention. As shown in FIG. 35, granules of superconductor particles 260 are used but are uncoated, i.e. having all external surfaces exposed. FIG. 36 illustrates an elongate member 260 including an external pipe container 264 of conductive material, an inner container 266, a plurality of the granules 260, and end caps 268. In this embodiment, the outer pipe container 264 is made of a conductive material from Table 2 and the inner pipe container 266 is made of protective material from Table 3. The inner pipe container 266 is located within the outer pipe container 264 as to form a layer covering an entire inner surface of the outer pipe container 264. The superconductor particles 260 are then inserted within the inner pipe container 266. The superconductor particles 260 are entirely surrounded by the inner pipe container 266 and the inner pipe container 266 is entirely surrounded by the outer pipe container 264. The end caps 268 are located over opposing ends of the pipe containers 264 and 266. The exposed surfaces of the superconductor particles 260 contact one another and some of the exposed surfaces contact an inner surface of the inner pipe container 266.

FIG. 37 illustrates a section of a wire 272 that is drawn from the elongate member 262. The thicknesses of the pipe containers 264 and 266 are reduced to form elongate casings 264A and 266A respectively. Some of the superconductor particles 260 contact the elongate casing 266A but are prevented from contacting or reacting with the elongate casing 264A. The elongate casing 264A has a wall thickness that is sufficiently thin that a respective one of the superconductor particles 260 can induce a region of the material of the elongate casing 264A to a superconductive state. These regions are linked in a chain throughout the entire length of the wire 272.

Figure 38:
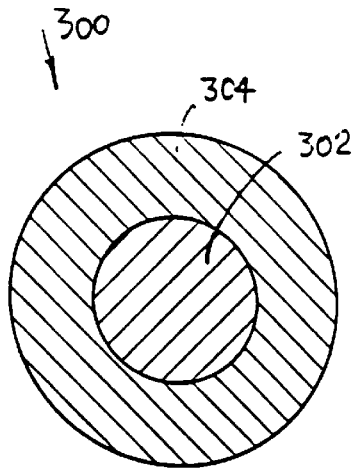
FIG. 38 is a cross-sectional view of a two component granule used for making a two component wire in a powder-in-tube process.
Figure 39:
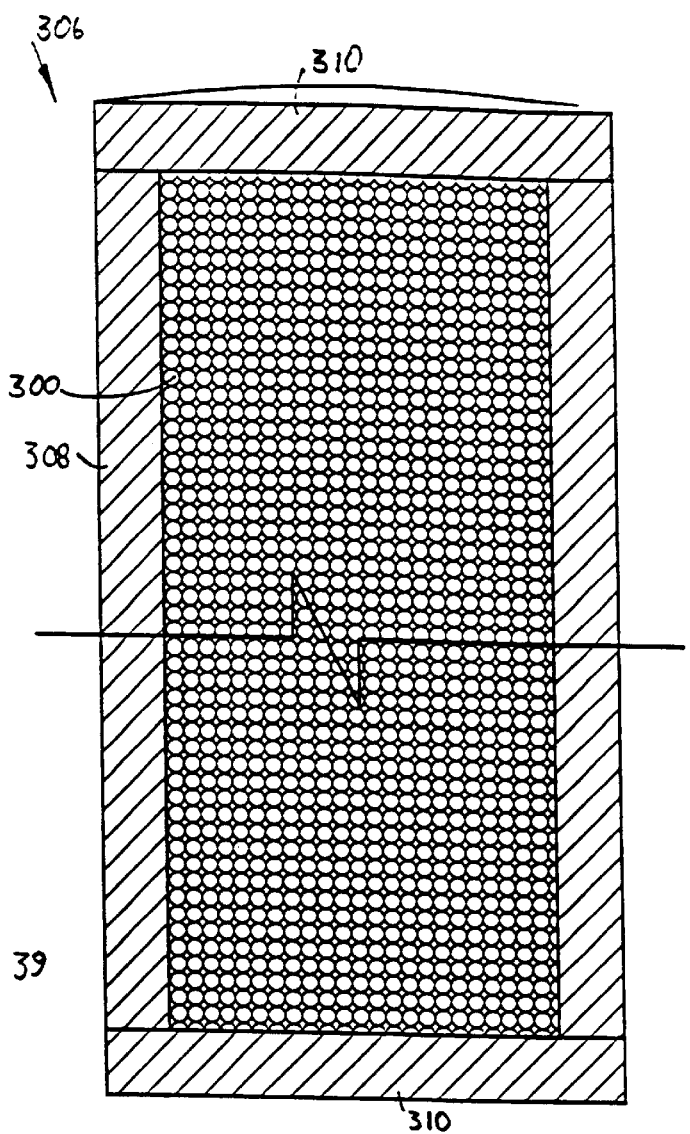
FIG. 39 is a cross-sectional view of an elongate member which is assembled from a plurality of the granules of FIG. 38.
Figure 40:
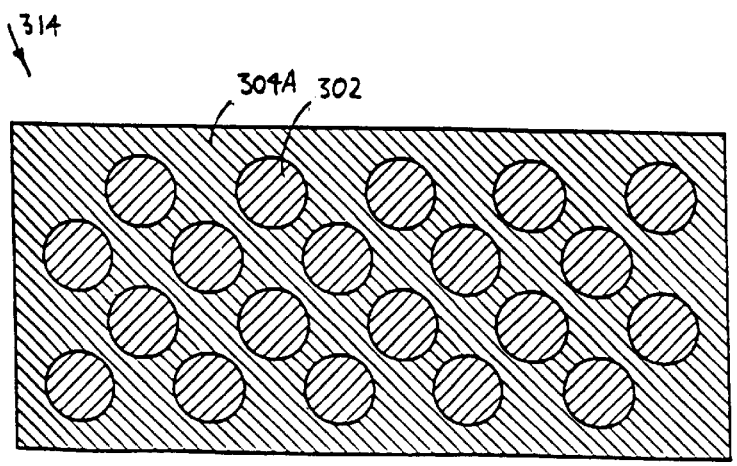
FIG. 40 is a cross-sectional view of a wire that is drawn from the elongate member of FIG. 39.

FIG. 38 to FIG. 40 illustrate a first embodiment of making a two-component powder-in-tube wire utilizing an intrinsic superconductor from Table 1 together with a conductive material from Table 2. FIG. 38 illustrates a granule 300 which includes a superconductor particle 302 with a layer of conductive material 304 formed thereon. The superconductor particle 302 is made of an intrinsic superconductor material from Table 1 and the layer 304 is formed directly onto and entirely surrounds the superconductor particle 302 and is made of a conductive material from Table 2.

FIG. 39 shows an elongate member 304 including an elongate pipe container 308, a plurality of the granules 300 within the pipe container 308, and end caps 310 closing off ends of the pipe container 308. FIG. 40 illustrates a core of a wire 314 that is drawn out of the elongate member 306. The conductive material 304 is sufficiently ductile so as to deform and form a matrix 304A that fills regions between the superconductor particles 302. The superconductor particles 302 drive regions of the matrix 304A to a superconductive state and these regions are linked to form an unbroken chain throughout the entire length of the wire 314.

FIG. 41 to FIG. 43 illustrate a second embodiment of forming a two-component powder-in-tube wire from an intrinsic superconductor material from Table 1 and a conductive material from Table 2. FIG. 41 illustrates superconductor particles 320 that are uncoated, i.e. having bare outer surfaces. As shown in FIG. 42, the superconductor particles 320 are located within an elongate pipe container 322 and ends of the elongate pipe container 322 are closed off with end caps 324 to complete assembly of an elongate member 326. In this embodiment, the elongate pipe container 322 is made of a conductive material from Table 2 and the superconductor particles 320 are made from an intrinsic superconductor material from Table 1.

FIG. 43 illustrates a section of a wire 332 that is drawn from the elongate member 326. The elongate pipe container 322 reduces in thickness to form an elongate casing 322A with the superconductor particles 320 therein. The superconductor particles 320 drive regions of the material of the elongate casing 322A to a superconductive state.

Magnesium Diboride as a Superconductor Material

It has been found that magnesium diboride ($MgB_2$) displays superconductive properties at 40K, a temperature at which helium is a vapor. It is also believed that magnesium diboride can be combined with any one of the conductive matrix materials in Table 2 without attacking the conductive matrix material. There is thus no need for an intermediate protective layer. Particles of the magnesium diboride can be located in direct contact to a conductive material discussed with reference to FIGS. 1 or 43.

It may be possible to use metallic borides other than magnesium diboride. Other metallic borides such as planar diborides may prove to be useful.

It may also be that a desirable conductive material is attacked by magnesium diboride or another planar diboride. Such an embodiment may require a protective material between the superconductive material and the conductive material.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. A superconductor comprising:
   particles made of a metallic boride superconductive material; and
   a conductive material selected to be driven to a superconductive state when in proximity to the superconductive material, an unbroken section of the conductive material being located sufficiently close to a plurality of the particles to be driven to a superconductive state by the superconductive material.

2. The superconductor of claim 1 wherein the metallic boride is magnesium diboride.

3. The superconductor of claim 1 wherein the conductive material is in contact with the superconductive material.

4. The superconductor of claim 1 wherein the conducting material is selected from the group consisting of niobium, indium, a niobium/titanium composition, tin, lead, a lead/bismuth alloy, mercury, tantalum, titanium, and vanadium.

5. The superconductor of claim 1 wherein the conductive material is more ductile than the superconductive material.

6. A method of making a superconductor, comprising:

forming a plurality of particles of a metallic boride superconductive material; and locating a conductive material adjacent the superconductive material, the conductive material being selected to be driven to a superconductive state when in close proximity to the superconductive material and an unbroken length of the conductive material being in sufficiently close proximity to a plurality of the particles to be driven to a superconductive state by the particles.

7. The method of claim 6 wherein the metallic boride is magnesium diboride.

8. The method of claim 6 further comprising:

assembling an elongate member from the particles and the superconductive material; and drawing the elongate member into a wire.

9. A superconductor comprising:

particles made of a superconductive material having a critical temperature of at least 35K; and a conductive material selected to be driven to a superconductive state when in proximity to the superconductive material, the conductive material contacting each of a plurality of the particles and an unbroken section of the conductive material being located sufficiently close to a plurality of the particles to be driven to a superconductive state by the superconductive particles.

10. The superconductor of claim 9 wherein the conductive material contacts substantially all surfaces of each particle.

11. The superconductor of claim 9 wherein the superconductive material is a metallic boride.

12. The superconductor of claim 9 wherein the conductive material is selected from the group including niobium, indium, a niobium/titanium composition, tin, lead, a lead/bismuth alloy, mercury, tantalum, titanium, and vanadium.

13. A superconductor comprising:

particles made of a superconductive material having a critical temperature of at least 35K; and a conductive material selected to be driven to a superconductive state when in proximity to the superconductive material and having an electron-phonon coupling coefficient of at least 0.2, an unbroken section of the conductive material being located sufficiently close to a plurality of the particles to be driven to a superconductive state by the superconductive particles.

* * * * *